US011901180B2

(12) United States Patent
Wang et al.

(10) Patent No.: US 11,901,180 B2
(45) **Date of Patent: *Feb. 13, 2024**

(54) METHOD OF BREAKING THROUGH ETCH STOP LAYER

(71) Applicant: Taiwan Semiconductor Manufacturing Co., Ltd., Hsinchu (TW)

(72) Inventors: Yu-Shih Wang, Tainan (TW); Hong-Jie Yang, Hsinchu (TW); Chia-Ying Lee, New Taipei (TW); Po-Nan Yeh, Hsinchu (TW); U-Ting Chiu, Hsinchu (TW); Chun-Neng Lin, Hsinchu (TW); Ming-Hsi Yeh, Hsinchu (TW); Kuo-Bin Huang, Jhubei (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

This patent is subject to a terminal disclaimer.

(21) Appl. No.: 17/670,990

(22) Filed: Feb. 14, 2022

(65) Prior Publication Data

US 2022/0172945 A1 Jun. 2, 2022

Related U.S. Application Data

(63) Continuation of application No. 16/907,634, filed on Jun. 22, 2020, now Pat. No. 11,276,571.

(Continued)

(51) Int. Cl.
*H01L 21/027* (2006.01)
*H01L 21/308* (2006.01)
*H01L 21/8234* (2006.01)
*H01L 29/66* (2006.01)
*H01L 29/78* (2006.01)

(52) U.S. Cl.
CPC ........ *H01L 21/0274* (2013.01); *H01L 21/308* (2013.01); *H01L 21/823431* (2013.01); *H01L 29/66795* (2013.01); *H01L 29/785* (2013.01)

(58) Field of Classification Search
CPC ............... H01L 21/0274; H01L 21/308; H01L 21/823431; H01L 29/66795; H01L 29/785; H01L 21/76832; H01L 21/76834; H01L 21/76897; H01L 21/76802;

(Continued)

(56) References Cited

U.S. PATENT DOCUMENTS 5,451,543 A * 9/1995 Woo .................... H01L 23/5226 438/634
5,741,741 A * 4/1998 Tseng ............... H01L 21/76813 438/666

(Continued)

*Primary Examiner* — Shahed Ahmed
*Assistant Examiner* — Vicki B. Booker
(74) *Attorney, Agent, or Firm* — Slater Matsil, LLP

(57) ABSTRACT

A photo resist layer is used to protect a dielectric layer and conductive elements embedded in the dielectric layer when patterning an etch stop layer underlying the dielectric layer. The photo resist layer may further be used to etch another dielectric layer underlying the etch stop layer, where etching the next dielectric layer exposes a contact, such as a gate contact. The bottom layer can be used to protect the conductive elements embedded in the dielectric layer from a wet etchant used to etch the etch stop layer.

20 Claims, 31 Drawing Sheets

Related U.S. Application Data

(60) Provisional application No. 62/953,747, filed on Dec. 26, 2019.

(58) Field of Classification Search
CPC ....... H01L 21/31144; H01L 21/823821; H01L 21/823871
See application file for complete search history.

(56) References Cited

U.S. PATENT DOCUMENTS

| | | | |
|---|---|---|---|
| 5,817,572 A * | 10/1998 | Chiang | H01L 21/76843 257/E21.585 |
| 6,042,999 A | 3/2000 | Lin et al. | |
| 6,506,683 B1 | 1/2003 | Hui et al. | |
| 6,962,771 B1 | 11/2005 | Liu et al. | |
| 9,105,490 B2 | 8/2015 | Wang et al. | |
| 9,236,267 B2 | 1/2016 | De et al. | |
| 9,236,300 B2 | 1/2016 | Liaw | |
| 9,406,804 B2 | 8/2016 | Huang et al. | |
| 9,443,769 B2 | 9/2016 | Wang et al. | |
| 9,520,482 B1 | 12/2016 | Chang et al. | |
| 9,548,366 B1 | 1/2017 | Ho et al. | |
| 9,576,814 B2 | 2/2017 | Wu et al. | |
| 9,831,183 B2 | 11/2017 | Lin et al. | |
| 9,859,386 B2 | 1/2018 | Ho et al. | |
| 2004/0157464 A1 | 8/2004 | Izumitani | |
| 2004/0259373 A1 | 12/2004 | Nagahara et al. | |
| 2006/0057842 A1* | 3/2006 | Wang | H01L 21/76814 438/638 |
| 2006/0131630 A1 | 6/2006 | Sun et al. | |
| 2007/0210454 A1 | 9/2007 | Chou et al. | |
| 2015/0206804 A1* | 7/2015 | Liou | H01L 29/518 438/666 |
| 2015/0262912 A1 | 9/2015 | Ting | |
| 2016/0118335 A1* | 4/2016 | Lee | H01L 23/53266 257/774 |
| 2016/0240485 A1 | 8/2016 | Zhu et al. | |
| 2018/0033866 A1 | 2/2018 | Liao et al. | |
| 2018/0301371 A1 | 10/2018 | Wang et al. | |
| 2019/0006231 A1 | 1/2019 | Tsai et al. | |
| 2020/0006083 A1 | 1/2020 | Huang et al. | |

* cited by examiner

300

300

METHOD OF BREAKING THROUGH ETCH STOP LAYER

CROSS-REFERENCE TO RELATED APPLICATION

This application is a continuation of U.S. application Ser. No. 16/907,634, filed on Jun. 22, 2020, now U.S. Pat. No. 11,276,571, issued on Mar. 15, 2022, which claims the benefit of U.S. Provisional Application No. 62/953,747 filed on Dec. 26, 2019, entitled "Etch Stop Layer Breakthrough with Lithography Bottom Layer," which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
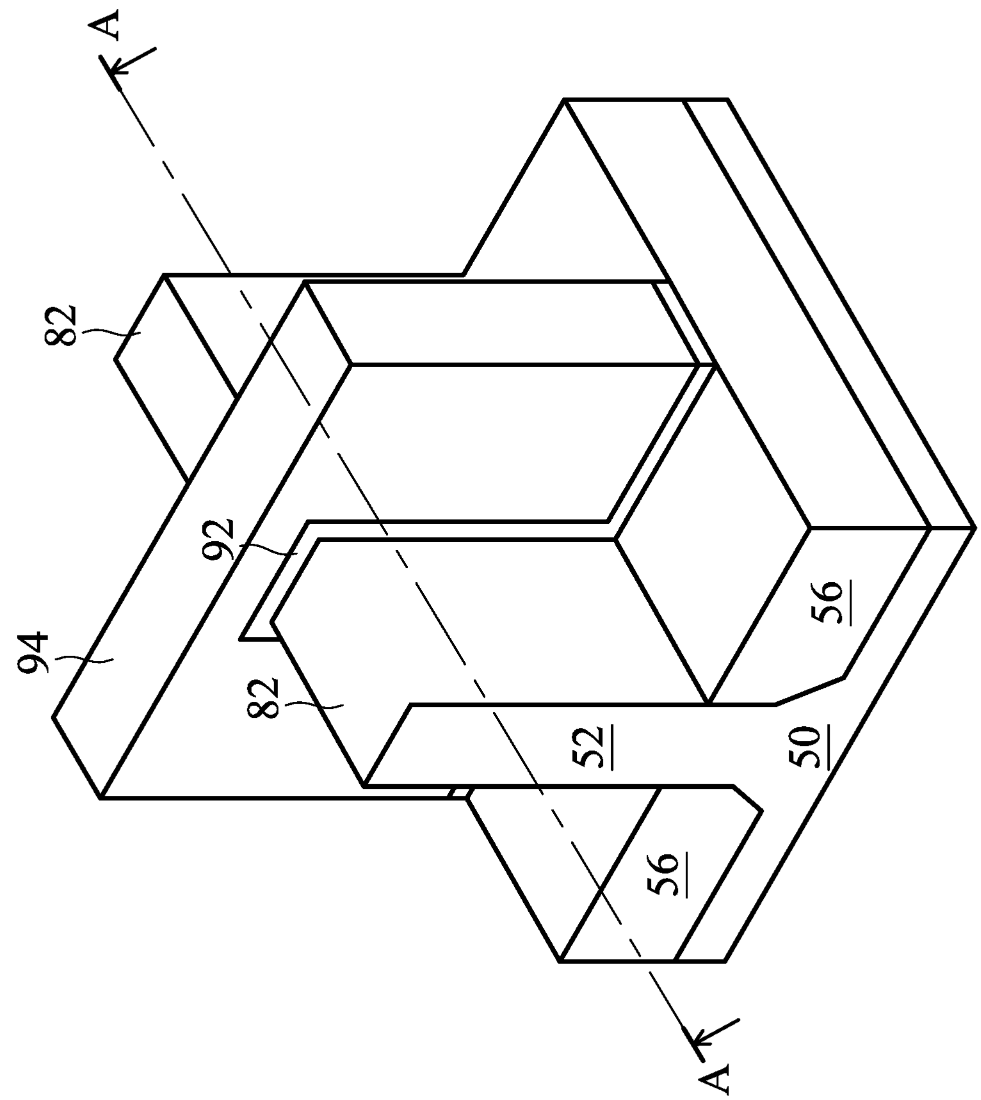
FIG. 1 illustrates an example of a fin field effect transistor (FinFET) in a three dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments include a process of forming a contact in a dielectric layer. When the dielectric layer is etched, a mask is provided by a photo mask layer, such as a bottom layer of a tri-layer photo mask. The mask protects areas of the dielectric layer which are not to be etched. A stop layer may underlie the dielectric layer, such as an etch stop layer. The etchant used to etch the dielectric layer is selective to the dielectric layer such that the etch rate with respect to the dielectric layer is greater than the etch rate with respect to the etch stop layer. A separate etchant is then used to break through the etch stop layer. This next etchant is selective to the etch stop layer and will not significantly etch the dielectric layer. Rather than remove the mask (which is no longer needed) the mask layer is left in place to protect other metal features which may be formed and embedded in the dielectric layer. For example, if the dielectric layer overlies a FinFET, first contacts may be formed to the source/drain regions, and then second contacts may be formed in a separate process to the gate electrodes. The mask layer may be left in place to protect the first contacts (e.g., to the source/drain regions) while the break through openings in the etch stop layer are made to form the second contacts. In some embodiments, another dielectric layer may underlie the etch stop layer, such as dielectric layer related to the formation of a self-aligned contact. In such embodiments, the bottom layer may still be left in place for the etching of the next dielectric layer, further protecting the dielectric layer and embedded first contacts.

FIG. 1 illustrates an example of a FinFET in a three-dimensional view, in accordance with some embodiments. Details have been omitted for simplicity. The FinFET comprises a fin 52 on a substrate 50 (e.g., a semiconductor substrate). Isolation regions 56 are disposed in the substrate 50, and the fin 52 protrudes above and from between neighboring isolation regions 56. Although the isolation regions 56 are described/illustrated as being separate from the substrate 50, as used herein the term "substrate" may be used to refer to just the semiconductor substrate or a semiconductor substrate inclusive of isolation regions. Additionally, although the fin 52 is illustrated as a single, continuous material as the substrate 50, the fin 52 and/or the substrate 50 may comprise a single material or a plurality of materials. In this context, the fin 52 refers to the portion extending between the neighboring isolation regions 56.

A gate dielectric layer 92 is along sidewalls and over a top surface of the fin 52, and a gate electrode 94 is over the gate dielectric layer 92. Source/drain regions 82 are disposed in opposite sides of the fin 52 with respect to the gate dielectric layer 92 and gate electrode 94. FIG. 1 further illustrates a reference cross-section that is used in referencing the figures herein. Cross-section A-A is perpendicular to the gate dielectric layer 92 and is along a longitudinal axis of the fin 52 and in a direction of, for example, a current flow between the source/drain regions 82 of the FinFET. Subsequent figures refer to this reference cross-section for clarity.

Some embodiments discussed herein are discussed in the context of FinFETs formed using a gate-last process. In other embodiments, a gate-first process may be used. Also, some embodiments contemplate aspects used in planar devices, such as planar FETs, nanostructure (e.g., nanosheet, nanowire, gate-all-around, or the like) field effect transistors (NSFETs), or the like.

In other embodiments, processes may be used to form contacts in an interconnect, such as an interconnect over a die or a redistribution structure over an embedded die. In some embodiments, embodiments can be used in a mid end of line (MEoL) process for metal plug.

FIGS. 2 through 23 are cross-sectional views of intermediate stages in the manufacturing of FinFETs, in accordance with some embodiments. In particular, FIGS. 2 through 23 are directed to the formation of contacts in the manufacturing of FinFETs. FIGS. 2 through 23 illustrate reference cross-section A-A illustrated in FIG. 1, except for multiple fins/FinFETs. FIG. 24 is a flow diagram related to the formation of the FinFETs illustrated in FIGS. 2 through 23, which will be referred to in the course of the following description.

Figure 2:
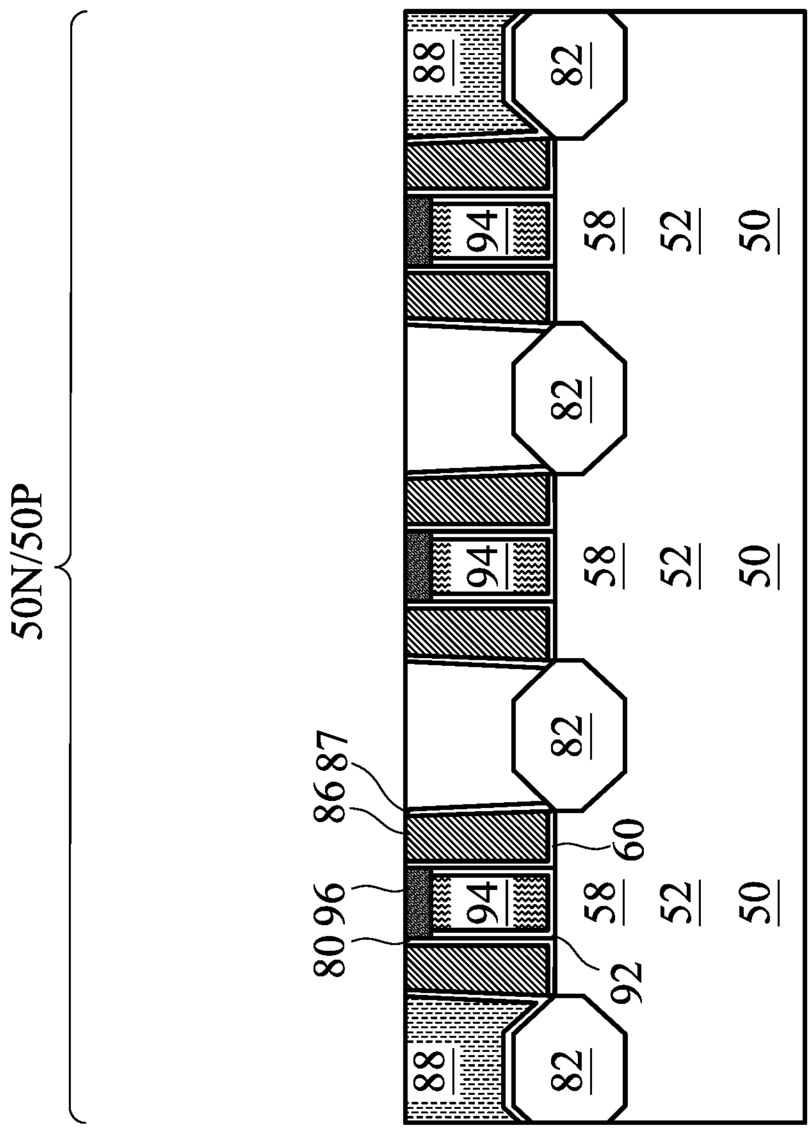
FIGS. 2 through 23 are cross-sectional views illustrating intermediate stages in the manufacturing of FinFETs, in accordance with some embodiments.

In FIG. 2, a FinFET has been partially formed. A description of the processes and materials used in the formation of the FinFET of FIG. 2 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 50 may have an n-type region 50N and a p-type region 50P. Accordingly, as indicated in FIG. 2, the illustrated embodiment may be applicable for either the n-type region 50N or the p-type region 50P. These labels are omitted in the remaining figures for simplicity, but it should be understood that the remaining figures can be applied to either region as well. For example, the structures illustrated in FIGS. 2 through 23 may be applicable to both the n-type region 50N and the p-type region 50P. Differences (if any) in the structures of the n-type region 50N and the p-type region 50P are described in the text accompanying each figure. The n-type region 50N can be for forming n-type devices, such as NMOS transistors, e.g., n-type FinFETs. The p-type region 50P can be for forming p-type devices, such as PMOS transistors, e.g., p-type FinFETs. The n-type region 50N may be physically separated from the p-type region 50P (as illustrated by divider 51), and any number of device features (e.g., other active devices, doped regions, isolation structures, etc.) may be disposed between the n-type region 50N and the p-type region 50P.

Fins 52 are formed in the substrate 50. This process corresponds to element 205 in the flow diagram 200 of FIG. 24. The fins 52 are semiconductor strips. In some embodiments, the fins 52 may be formed in the substrate 50 by etching trenches in the substrate 50. The etching may be any acceptable etch process, such as a reactive ion etch (RIE), neutral beam etch (NBE), the like, or a combination thereof. The etch may be anisotropic.

The fins may be patterned by any suitable method. For example, the fins 52 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins. In some embodiments, the mask (or other layer) may remain on the fins 52.

An insulation material may be formed over the substrate 50 and between neighboring fins 52. This process corresponds to element 210 in the flow diagram 200 of FIG. 24. The insulation material may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. An anneal process may be performed once the insulation material is formed. In an embodiment, the insulation material is formed such that excess insulation material covers the fins 52. The insulation material may be a single layer, or in some embodiments may utilize multiple layers. For example, in some embodiments a liner (not shown) may first be formed along a surface of the substrate 50 and the fins 52. Thereafter, a fill material, such as those discussed above may be formed over the liner.

A removal process is applied to the insulation material to remove excess insulation material over the fins 52. This process corresponds to element 215 in the flow diagram 200 of FIG. 24. In some embodiments, a planarization process such as a chemical mechanical polish (CMP), an etch-back process, combinations thereof, or the like may be utilized. The planarization process exposes the fins 52 such that top surfaces of the fins 52 and the insulation material are level after the planarization process is complete. In embodiments in which a mask remains on the fins 52, the planarization process may expose the mask or remove the mask such that top surfaces of the mask or the fins 52, respectively, and the insulation material are level after the planarization process is complete.

The insulation material is recessed to form Shallow Trench Isolation (STI) regions 56 (see FIG. 1). This process corresponds to element 220 in the flow diagram 200 of FIG. 24. The insulation material is recessed such that upper portions of fins 52 in the n-type region 50N and in the p-type region 50P protrude from between neighboring STI regions 56. Further, the top surfaces of the STI regions 56 may have a flat surface as illustrated, a convex surface, a concave surface (such as dishing), or a combination thereof. The top surfaces of the STI regions 56 may be formed flat, convex, and/or concave by an appropriate etch. The STI regions 56 may be recessed using an acceptable etching process, such as one that is selective to the material of the insulation material (e.g., etches the material of the insulation material at a faster rate than the material of the fins 52). For example, an oxide removal using, for example, dilute hydrofluoric (dHF) acid may be used.

The process for forming the fins 52 described above is just one example of how the fins 52 may be formed. In some embodiments, the fins may be formed by an epitaxial growth process. For example, a dielectric layer can be formed over a top surface of the substrate 50, and trenches can be etched through the dielectric layer to expose the underlying substrate 50. Homoepitaxial structures can be epitaxially grown in the trenches, and the dielectric layer can be recessed such that the homoepitaxial structures protrude from the dielectric layer to form fins. Additionally, in some embodiments, heteroepitaxial structures can be used for the fins 52. For example, the fins 52 in FIG. 5 can be recessed, and a material different from the fins 52 may be epitaxially grown over the recessed fins 52. In such embodiments, the fins 52 comprise the recessed material as well as the epitaxially grown material disposed over the recessed material. In an even further embodiment, a dielectric layer can be formed over a top surface of the substrate 50, and trenches can be etched through the dielectric layer. Heteroepitaxial structures can then be epitaxially grown in the trenches using a material different from the substrate 50, and the dielectric layer can be recessed such that the heteroepitaxial structures protrude from the dielectric layer to form the fins 52. In some embodiments where homoepitaxial or heteroepitaxial structures are epitaxially grown, the epitaxially grown materials may be in situ doped during growth, which may obviate prior and subsequent implantations although in situ and implantation doping may be used together.

Still further, it may be advantageous to epitaxially grow a material in n-type region 50N (e.g., an NMOS region) different from the material in p-type region 50P (e.g., a PMOS region). In various embodiments, upper portions of the fins 52 may be formed from silicon-germanium ($Si_xGe_{1-x}$, where x can be in the range of 0 to 1), silicon carbide, pure or substantially pure germanium, a III-V compound semiconductor, a II-VI compound semiconductor, or the like. For example, the available materials for forming III-V compound semiconductor include, but are not limited to, indium arsenide, aluminum arsenide, gallium arsenide, indium phosphide, gallium nitride, indium gallium arsenide, indium aluminum arsenide, gallium antimonide, aluminum antimonide, aluminum phosphide, gallium phosphide, and the like.

Appropriate wells (not shown) may be formed in the fins 52 and/or the substrate 50. This process corresponds to element 225 in the flow diagram 200 of FIG. 24. In some embodiments, a P well may be formed in the n-type region 50N, and an N well may be formed in the p-type region 50P. In some embodiments, a P well or an N well are formed in both the n-type region 50N and the p-type region 50P.

In the embodiments with different well types, the different implant steps for the n-type region 50N and the p-type region 50P may be achieved using a photoresist and/or other masks (not shown). For example, a photoresist may be formed over the fins 52 and the STI regions 56 in the n-type region 50N. The photoresist is patterned to expose the p-type region 50P of the substrate 50. The photoresist can be formed by using a spin-on technique and can be patterned using acceptable photolithography techniques. Once the photoresist is patterned, an n-type impurity implant is performed in the p-type region 50P, and the photoresist may act as a mask to substantially prevent n-type impurities from being implanted into the n-type region 50N. The n-type impurities may be phosphorus, arsenic, antimony, or the like implanted in the region to a concentration of equal to or less than $10^{18}$ $cm^{-3}$, such as between about $10^{16}$ $cm^{-3}$ and about $10^{18}$ $cm^{-3}$. After the implant, the photoresist is removed, such as by an acceptable ashing process.

Following the implanting of the p-type region 50P, a photoresist is formed over the fins 52 and the STI regions 56 in the p-type region 50P. The photoresist is patterned to expose the n-type region 50N of the substrate 50. The photoresist can be formed by using a spin-on technique and can be patterned using acceptable photolithography techniques. Once the photoresist is patterned, a p-type impurity implant may be performed in the n-type region 50N, and the photoresist may act as a mask to substantially prevent p-type impurities from being implanted into the p-type region 50P. The p-type impurities may be boron, boron fluoride, indium, or the like implanted in the region to a concentration of equal to or less than $10^{18}$ $cm^{-3}$, such as between about $10^{16}$ $cm^{-3}$ and about $10^{18}$ $cm^{-3}$. After the implant, the photoresist may be removed, such as by an acceptable ashing process.

After the implants of the n-type region 50N and the p-type region 50P, an anneal may be performed to repair implant damage and to activate the p-type and/or n-type impurities that were implanted. In some embodiments, the grown materials of epitaxial fins may be in situ doped during growth, which may obviate the implantations, although in situ and implantation doping may be used together.

A dummy dielectric layer and dummy gate layer may be formed and patterned to form dummy gates, which are later replaced in a gate replacement process. This process corresponds to element 230 in the flow diagram 200 of FIG. 24. The dummy dielectric layer is formed on the fins 52. The dummy dielectric layer may be, for example, silicon oxide, silicon nitride, a combination thereof, or the like, and may be deposited or thermally grown according to acceptable techniques. A dummy gate layer is formed over the dummy dielectric layer, and a mask layer is formed over the dummy gate layer. The dummy gate layer may be deposited over the dummy dielectric layer and then planarized, such as by a CMP. The mask layer may be deposited over the dummy gate layer. The dummy gate layer may be a conductive or non-conductive material and may be selected from a group including amorphous silicon, polycrystalline-silicon (polysilicon), poly-crystalline silicon-germanium (poly-SiGe), metallic nitrides, metallic silicides, metallic oxides, and metals. The dummy gate layer may be deposited by physical vapor deposition (PVD), CVD, sputter deposition, or other techniques for depositing the selected material. The dummy gate layer may be made of other materials that have a high etching selectivity from the etching of isolation regions, e.g., the STI regions 56 and/or the dummy dielectric layer. The mask layer may include one or more layers of, for example, silicon nitride, silicon oxynitride, or the like.

The mask layer may be patterned using acceptable photolithography and etching techniques to form masks. This process corresponds to element 235 in the flow diagram 200 of FIG. 24. The pattern of the masks then may be transferred to the dummy gate layer. In some embodiments, the pattern of the masks 74 may also be transferred to the dummy dielectric layer 60 by an acceptable etching technique to form dummy gates. The dummy gates cover respective channel regions 58 of the fins 52. The pattern of the masks may be used to physically separate each of the dummy gates from adjacent dummy gates. The dummy gates may also have a lengthwise direction substantially perpendicular to the lengthwise direction of respective epitaxial fins 52.

Gate seal spacers 80 can be formed on exposed surfaces of the dummy gates, the masks, and/or the fins 52. This process corresponds to element 240 in the flow diagram 200 of FIG. 24. A thermal oxidation or a deposition followed by an anisotropic etch may form the gate seal spacers 80. The gate seal spacers 80 may be formed of silicon oxide, silicon nitride, silicon oxynitride, or the like.

After the formation of the gate seal spacers 80, implants for lightly doped source/drain (LDD) regions (not explicitly illustrated) may be performed. In the embodiments with different device types, similar to the implants discussed above, a mask, such as a photoresist, may be formed over the n-type region 50N, while exposing the p-type region 50P, and appropriate type (e.g., p-type) impurities may be implanted into the exposed fins 52 in the p-type region 50P. The mask may then be removed. Subsequently, a mask, such as a photoresist, may be formed over the p-type region 50P while exposing the n-type region 50N, and appropriate type impurities (e.g., n-type) may be implanted into the exposed fins 52 in the n-type region 50N. The mask may then be removed. The n-type impurities may be the any of the n-type impurities previously discussed, and the p-type impurities may be the any of the p-type impurities previously discussed. The lightly doped source/drain regions may have a concentration of impurities of from about $10^{15}$ $cm^{-3}$ to about $10^{19}$ $cm^{-3}$. An anneal may be used to repair implant damage and to activate the implanted impurities.

Gate spacers 86 are formed on the gate seal spacers 80 along sidewalls of the dummy gates and the masks. The gate spacers 86 may be formed by conformally depositing an insulating material and subsequently anisotropically etching the insulating material. The insulating material of the gate spacers 86 may be silicon oxide, silicon nitride, silicon oxynitride, silicon carbonitride, a combination thereof, or the like.

It is noted that the above disclosure generally describes a process of forming spacers and LDD regions. Other processes and sequences may be used. For example, fewer or additional spacers may be utilized, different sequence of steps may be utilized (e.g., the gate seal spacers 80 may not be etched prior to forming the gate spacers 86, yielding "L-shaped" gate seal spacers, spacers may be formed and removed, and/or the like. Furthermore, the n-type and p-type devices may be formed using a different structures and steps. For example, LDD regions for n-type devices may be formed prior to forming the gate seal spacers 80 while the LDD regions for p-type devices may be formed after forming the gate seal spacers 80.

Epitaxial source/drain regions 82 are formed in the fins 52. This process corresponds to elements 245 and 250 in the flow diagram 200 of FIG. 24. The epitaxial source/drain regions 82 are formed in the fins 52 such that each dummy gate 72 is disposed between respective neighboring pairs of the epitaxial source/drain regions 82. In some embodiments the epitaxial source/drain regions 82 may extend into, and may also penetrate through, the fins 52. In some embodiments, the gate spacers 86 are used to separate the epitaxial source/drain regions 82 from the dummy gates 72 by an appropriate lateral distance so that the epitaxial source/drain regions 82 do not short out subsequently formed gates of the resulting FinFETs. A material of the epitaxial source/drain regions 82 may be selected to exert stress in the respective channel regions 58, thereby improving performance.

The epitaxial source/drain regions 82 in the n-type region 50N may be formed by masking the p-type region 50P and etching source/drain regions of the fins 52 in the n-type region 50N to form recesses in the fins 52. Then, the epitaxial source/drain regions 82 in the n-type region 50N are epitaxially grown in the recesses. The epitaxial source/drain regions 82 may include any acceptable material, such as appropriate for n-type FinFETs. For example, if the fin 52 is silicon, the epitaxial source/drain regions 82 in the n-type region 50N may include materials exerting a tensile strain in the channel region 58, such as silicon, silicon carbide, phosphorous doped silicon carbide, silicon phosphide, or the like. The epitaxial source/drain regions 82 in the n-type region 50N may have surfaces raised from respective surfaces of the fins 52 and may have facets.

The epitaxial source/drain regions 82 in the p-type region 50P may be formed by masking the n-type region 50N and etching source/drain regions of the fins 52 in the p-type region 50P to form recesses in the fins 52. Then, the epitaxial source/drain regions 82 in the p-type region 50P are epitaxially grown in the recesses. The epitaxial source/drain regions 82 may include any acceptable material, such as appropriate for p-type FinFETs. For example, if the fin 52 is silicon, the epitaxial source/drain regions 82 in the p-type region 50P may comprise materials exerting a compressive strain in the channel region 58, such as silicon-germanium, boron doped silicon-germanium, germanium, germanium tin, or the like. The epitaxial source/drain regions 82 in the p-type region 50P may have surfaces raised from respective surfaces of the fins 52 and may have facets.

The epitaxial source/drain regions 82 and/or the fins 52 may be implanted with dopants to form source/drain regions, similar to the process previously discussed for forming lightly-doped source/drain regions, followed by an anneal. The source/drain regions may have an impurity concentration of between about $10^{19}$ $cm^{-3}$ and about $10^{21}$ $cm^{-3}$. The n-type and/or p-type impurities for source/drain regions may be any of the impurities previously discussed. In some embodiments, the epitaxial source/drain regions 82 may be in situ doped during growth.

As a result of the epitaxy processes used to form the epitaxial source/drain regions 82 in the n-type region 50N and the p-type region 50P, upper surfaces of the epitaxial source/drain regions have facets which expand laterally outward beyond sidewalls of the fins 52. In some embodiments, these facets cause adjacent source/drain regions 82 of a same FinFET to merge. In other embodiments, adjacent source/drain regions 82 remain separated after the epitaxy process is completed. In these embodiments, gate spacers 86 may be formed covering a portion of the sidewalls of the fins 52 that extend above the STI regions 56 thereby blocking the epitaxial growth. In some other embodiments, the spacer etch used to form the gate spacers 86 may be adjusted to remove the spacer material to allow the epitaxially grown region to extend to the surface of the STI region 56.

A first interlayer dielectric (ILD) 88 is deposited over the structure. This process corresponds to element 255 in the flow diagram 200 of FIG. 24. The first ILD 88 may be formed of any suitable material, which may include a dielectric material having a low dielectric constant (k value) lower than 3.8, lower than about 3.0, or lower than about 2.5, for example, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, a contact etch stop layer (CESL) 87 is disposed between the first ILD 88 and the epitaxial source/drain regions 82, the masks, and the gate spacers 86. The CESL 87 may comprise a dielectric material, such as, silicon nitride, silicon oxide, silicon oxynitride, or the like, having a lower etch rate than the material of the overlying first ILD 88 during a process of etching the overlying first ILD 88.

A planarization process, such as a CMP, may be performed to level the top surface of the first ILD 88 with the top surfaces of the dummy gates or the masks. The planarization process may also remove the masks on the dummy gates, and portions of the gate seal spacers 80 and the gate spacers 86 along sidewalls of the masks. After the planarization process, top surfaces of the dummy gates, the gate seal spacers 80, the gate spacers 86, and the first ILD 88 are level. Accordingly, the top surfaces of the dummy gates are exposed through the first ILD 88. In some embodiments, the masks may remain, in which case the planarization process levels the top surface of the first ILD 88 with the top surfaces of the top surface of the masks.

The dummy gates are then replaced. This process corresponds to element 260 in the flow diagram 200 of FIG. 24. The dummy gates, and the masks if present, are removed in an etching step(s), so that recesses are formed. Portions of the dummy dielectric layer in the recesses may also be removed. In some embodiments, only the dummy gates are removed and the dummy dielectric layer remains and is exposed by the recesses. In some embodiments, the dummy dielectric layer is removed from recesses in a first region of a die (e.g., a core logic region) and remains in recesses in a second region of the die (e.g., an input/output region). In some embodiments, the dummy gates are removed by an anisotropic dry etch process. For example, the etching process may include a dry etch process using reaction gas(es) that selectively etch the dummy gates with little or no etching of the first ILD 88 or the gate spacers 86. Each recess exposes and/or overlies a channel region 58 of a respective fin 52. Each channel region 58 is disposed between neighboring pairs of the epitaxial source/drain regions 82. During the removal, the dummy dielectric layer may be used as an etch stop layer when the dummy gates are etched. The dummy dielectric layer may then be optionally removed after the removal of the dummy gates.

Gate dielectric layers 92 and gate electrodes 94 are formed for replacement gates. Gate dielectric layers 92 include one or more layers deposited in the recesses 90, such as on the top surfaces and the sidewalls of the fins 52 and on sidewalls of the gate seal spacers 80/gate spacers 86. The gate dielectric layers 92 may also be formed on the top surface of the first ILD 88. In some embodiments, the gate dielectric layers 92 comprise one or more dielectric layers, such as one or more layers of silicon oxide, silicon nitride, metal oxide, metal silicate, or the like. For example, in some embodiments, the gate dielectric layers 92 include an interfacial layer of silicon oxide formed by thermal or chemical oxidation and an overlying high-k dielectric material, such as a metal oxide or a silicate of hafnium, aluminum, zirconium, lanthanum, manganese, barium, titanium, lead, and combinations thereof. The gate dielectric layers 92 may include a dielectric layer having a k value greater than about 7.0. The formation methods of the gate dielectric layers 92 may include Molecular-Beam Deposition (MBD), ALD, PECVD, and the like. In embodiments where portions of the dummy gate dielectric remains in the recesses 90, the gate dielectric layers 92 include a material of the dummy gate dielectric (e.g., $SiO_2$).

The gate electrodes 94 are deposited over the gate dielectric layers 92, respectively, and fill the remaining portions of the recesses. The gate electrodes 94 may include a metal-containing material such as titanium nitride, titanium oxide, tantalum nitride, tantalum carbide, cobalt, ruthenium, aluminum, tungsten, combinations thereof, or multi-layers thereof. For example, although a single layer gate electrode 94 is illustrated in FIG. 2, the gate electrode 94 may comprise any number of liner layers, any number of work function tuning layers, and a fill material. After the filling of the recesses, a planarization process, such as a CMP, may be performed to remove the excess portions of the gate dielectric layers 92 and the material of the gate electrodes 94, which excess portions are over the top surface of the first ILD 88. The remaining portions of material of the gate electrodes 94 and the gate dielectric layers 92 thus form replacement gates of the resulting FinFETs. The gate electrodes 94 and the gate dielectric layers 92 may be collectively referred to as a "gate stack." The gate and the gate stacks may extend along sidewalls of a channel region 58 of the fins 52.

The formation of the gate dielectric layers 92 in the n-type region 50N and the p-type region 50P may occur simultaneously such that the gate dielectric layers 92 in each region are formed from the same materials, and the formation of the gate electrodes 94 may occur simultaneously such that the gate electrodes 94 in each region are formed from the same materials. In some embodiments, the gate dielectric layers 92 in each region may be formed by distinct processes, such that the gate dielectric layers 92 may be different materials, and/or the gate electrodes 94 in each region may be formed by distinct processes, such that the gate electrodes 94 may be different materials. Various masking steps may be used to mask and expose appropriate regions when using distinct processes.

In some embodiments, a gate mask 96 is formed over the gate stack (including a gate dielectric layer 92 and a corresponding gate electrode 94), and the gate mask may be disposed between opposing portions of the gate spacers 86. In some embodiments, forming the gate mask 96 includes recessing the gate stack so that a recess is formed directly over the gate stack and between opposing portions of gate spacers 86. A gate mask 96 comprising one or more layers of dielectric material, such as silicon nitride, silicon oxynitride, or the like, is filled in the recess, followed by a planarization process to remove excess portions of the dielectric material extending over the first ILD 88. In other embodiments, the gate mask 96 may be formed in a later processing step.

Figure 3:
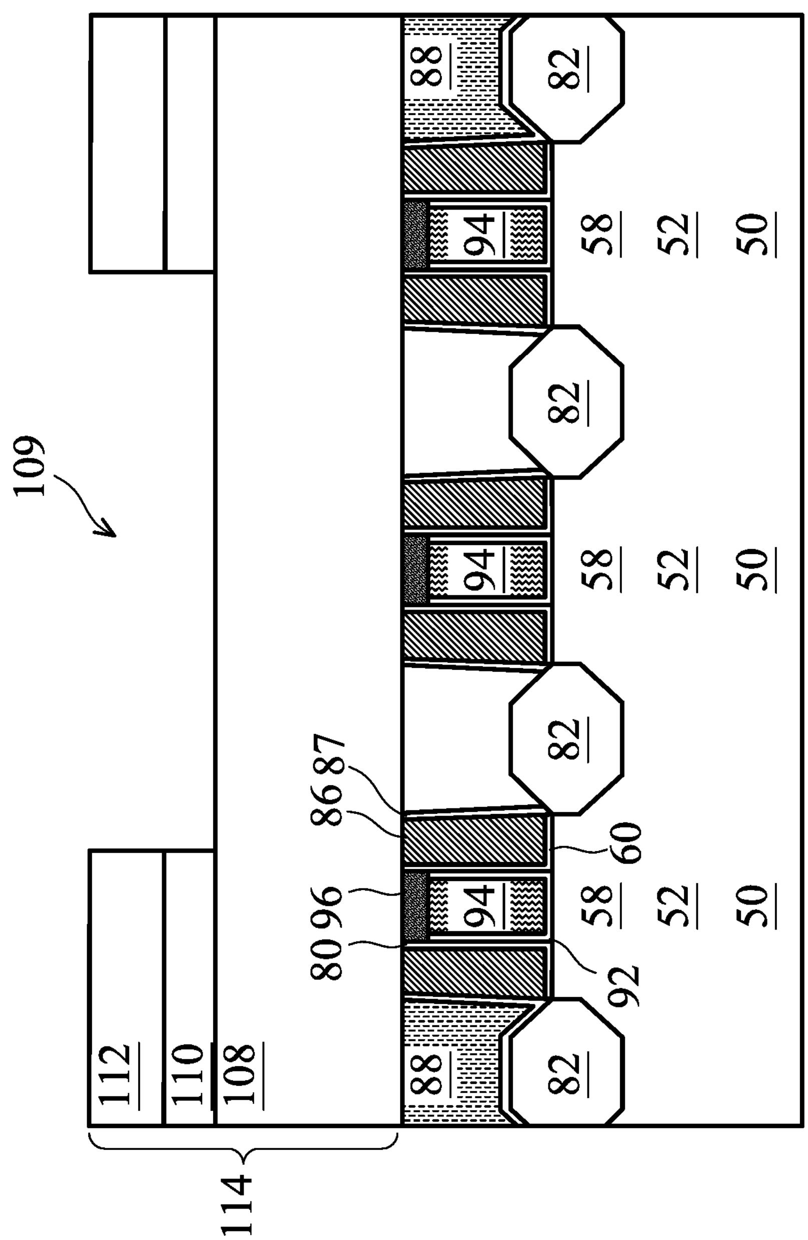

FIGS. 3 through 6 illustrate a process for forming self-aligned source/drain contacts, in accordance with some embodiments. This process corresponds to element 265 in the flow diagram 200 of FIG. 24. In FIG. 3, photo mask 114 may include a single photo resist or a tri-layer photo mask. A single photo resist may include only the layer 108. In embodiments using a tri-layer, the tri-layer may include an under layer 108 (sometimes referred to as a bottom layer), a middle layer 110 over the under layer 108, and an upper layer 112 over the middle layer 110. In accordance with some embodiments of the present disclosure, the under layer 108 and the upper layer 112 are formed of photo resists, which are formed of organic materials. The middle layer 110 may be formed of an inorganic material, which may be a nitride (such as silicon nitride), an oxynitride (such as silicon oxynitride), an oxide (such as silicon oxide), or the like. The middle layer 110 has a high etching selectivity with relative to the upper layer 112 and the under layer 108, and hence the upper layer 112 is used as an etching mask for the patterning of the middle layer 110, and the middle layer 110 is used as an etching mask for the patterning of the under layer 108. After photo mask 114 is applied, the upper layer 112 is patterned in a photo lithography process. The patterned upper layer 112 is then used to pattern the middle layer 110 by extending the opening 109 in upper layer 112 into the middle layer 110.

Figure 4:
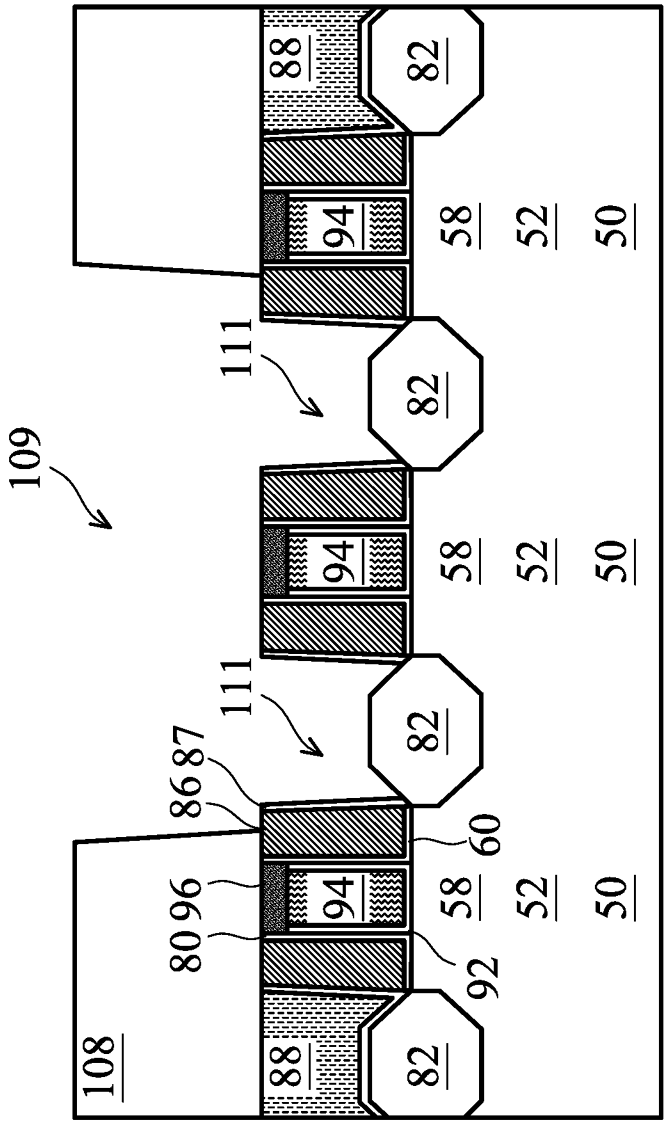

In FIG. 4, the under layer 108 is patterned by extending the opening 109 into the under layer 108 by etching the under layer 108 while using the middle layer 110 as an etch mask. The first ILD 88 is exposed through the opening 109 and then the exposed first ILD 88 is removed to form openings 111 over the source/drain regions 82. In the process of etching the under layer 108, the middle layer 110 may be consumed.

Figure 5:
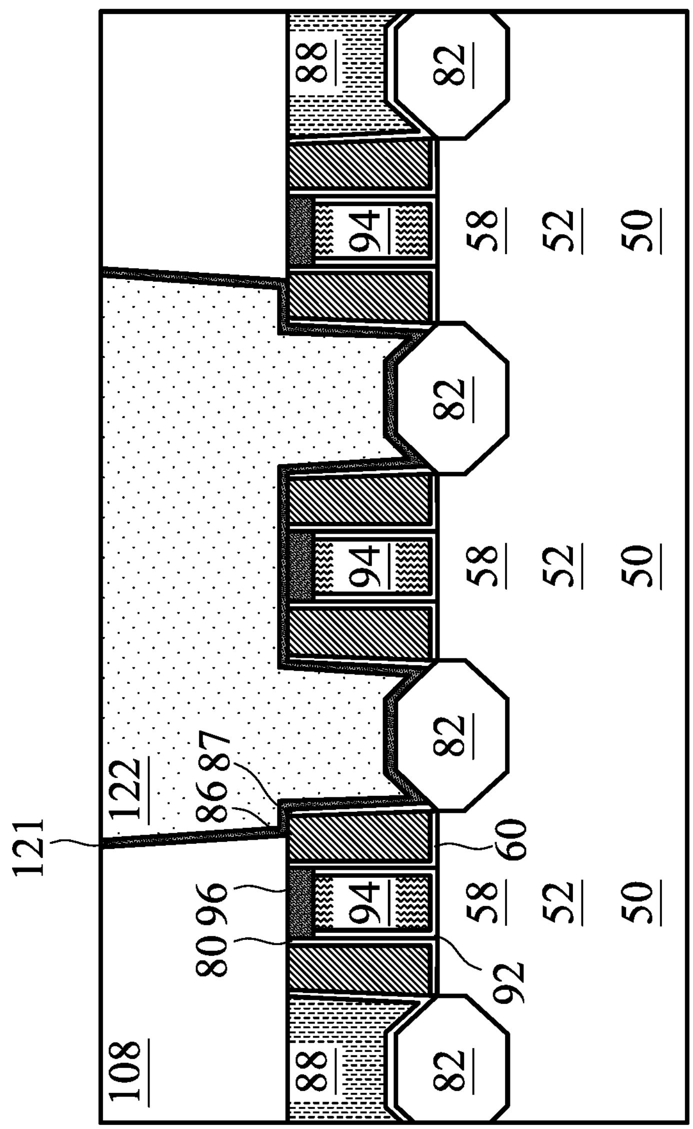

In FIG. 5, the openings 111 and openings 109 are filled with a liner 121, such as a diffusion barrier layer, an adhesion layer, or the like, and a conductive material 122. The liner 121 may include titanium, titanium nitride, tantalum, tantalum nitride, or the like formed by ALD, CVD, or the like. The conductive material 122 may be copper, a copper alloy, silver, gold, tungsten, cobalt, aluminum, nickel, titanium, tantalum, alloys thereof, combinations thereof, or the like, but other suitable metal may be used. A planarization process, such as a CMP, may be performed to remove excess material from a surface of the under layer 108.

Figure 6:
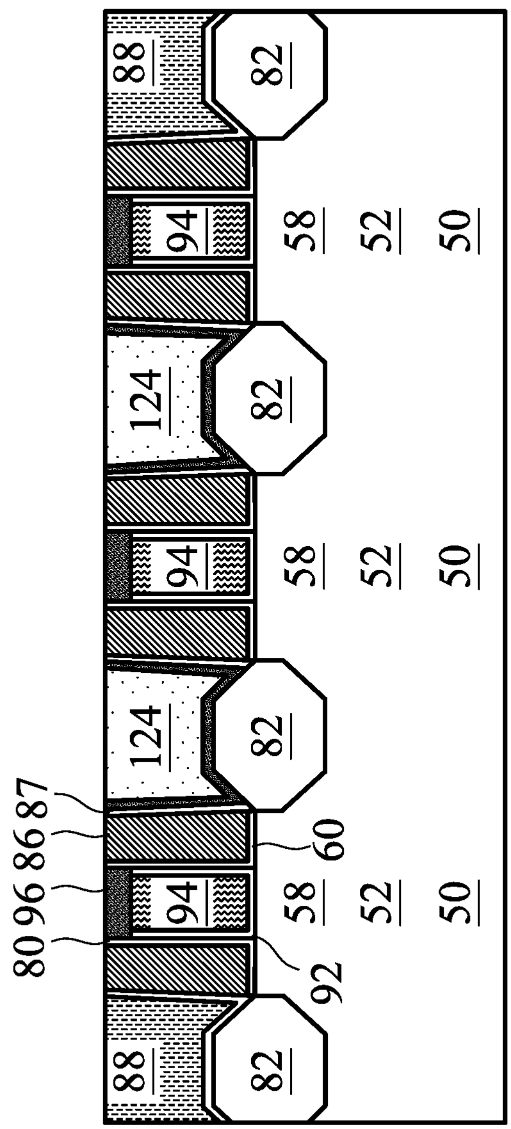

In FIG. 6, the conductive material 122 and under layer 108 may continue to be planarized to level the upper surfaces of the conductive material 122 with upper surfaces of the gate spacers 86 and gate mask 96. The conductive material 122 is thus separated into different self-aligned source/drain contacts 124.

Figure 7:
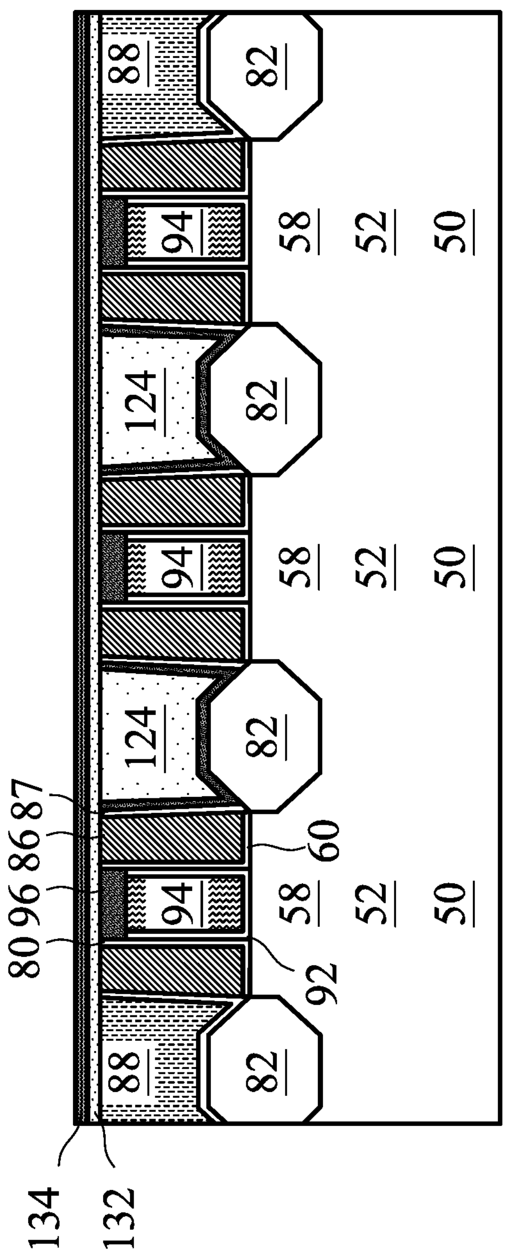

In FIG. 7, a dielectric layer 132 may be formed over the gate electrodes 94, the contacts 124, the first ILD 88, and the gate spacers 86. This process corresponds to element 270 in the flow diagram 200 of FIG. 24. In some embodiments, the gate mask 96 and contacts 124 may be recessed prior to the formation of the dielectric layer 132. In some embodiments, the gate mask 96 is not previously formed and the gate electrode 94 is recessed with the contacts 124 and the dielectric layer 132 is formed over the gate electrode 94 so that part of the dielectric layer 132 becomes the gate mask 96. In an embodiment, the dielectric layer 132 may be a dielectric material such as silicon nitride, although any suitable dielectric material may alternatively be utilized. The dielectric layer 132 may be formed using a process such as chemical vapor deposition to a thickness of between about 20 Å and about 50 Å, such as about 30 Å. However, any suitable process, such as PECVD, ALD, or the like, and any suitable thickness may alternatively be utilized. The dielectric layer 132 may be formed to restore damage which may have been caused due to the formation of the self-aligned source/drain contacts 124. In some embodiments, the dielectric layer 132 may be conformally formed and planarized to level an upper surface thereof, while in other embodiments, the dielectric layer 132 may be left unplanarized.

An etch stop layer (ESL) 134 may also be formed over the dielectric layer 132. This process corresponds to element 275 in the flow diagram 200 of FIG. 24. In an embodiment, the ESL 134 may include a dielectric material such as aluminum oxide, silicon carbide, silicon nitride, or the like. The ESL 134 may be formed of a nitride, a silicon-carbon based material, a carbon-doped oxide, an oxygen-doped carbide, a nitrogen-doped silicon carbide, and/or combinations thereof. The ESL 134 may include a metallic material. The formation methods of the ESL 134 include Plasma Enhanced Chemical Vapor Deposition (PECVD) or other methods such as High-Density Plasma CVD (HDPCVD), Atomic Layer Deposition (ALD), low pressure CVD (LPCVD), physical vapor deposition (PVD), and the like. The materials of the ESL 134 may be deposited to a total thickness of between about 20 Å and about 40 Å, such as about 30 Å.

Figure 8:
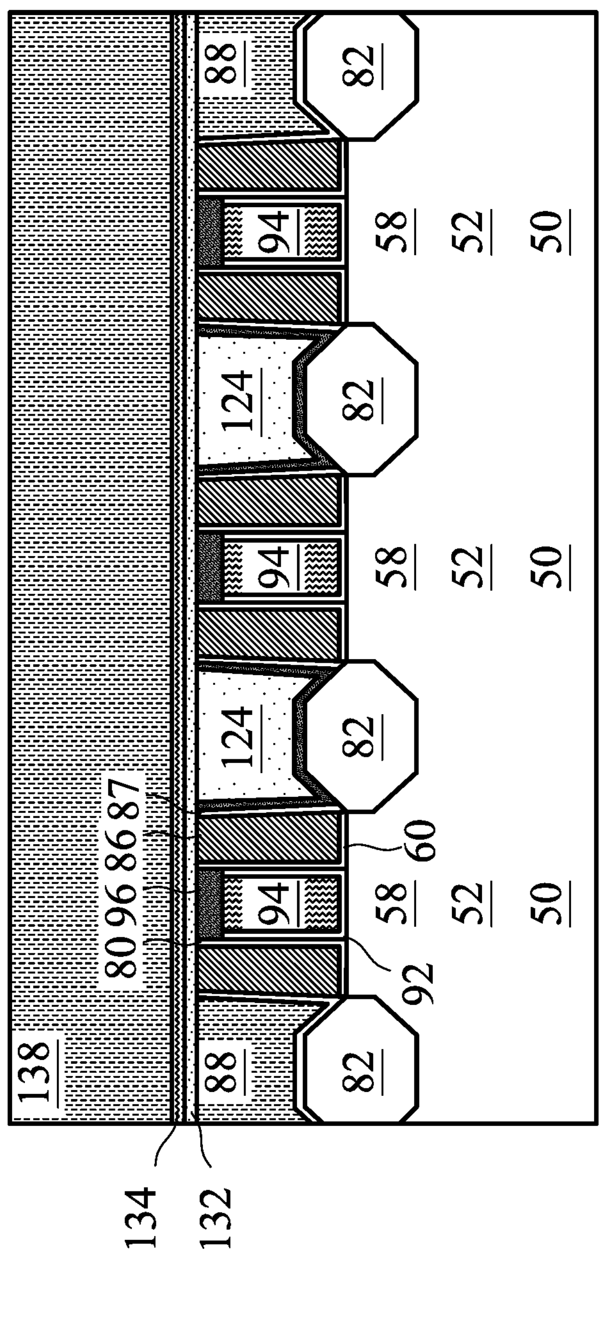

In FIG. 8, a second ILD 138 is deposited over the ESL 134. This process corresponds to element 280 in the flow diagram 200 of FIG. 24. In some embodiments, the second ILD 138 is a flowable film formed by a flowable CVD method. In some embodiments, the second ILD 138 is formed of a dielectric material such as PSG, BSG, BPSG, USG, or the like, and may be deposited by any suitable method, such as CVD and PECVD.

Figure 9:
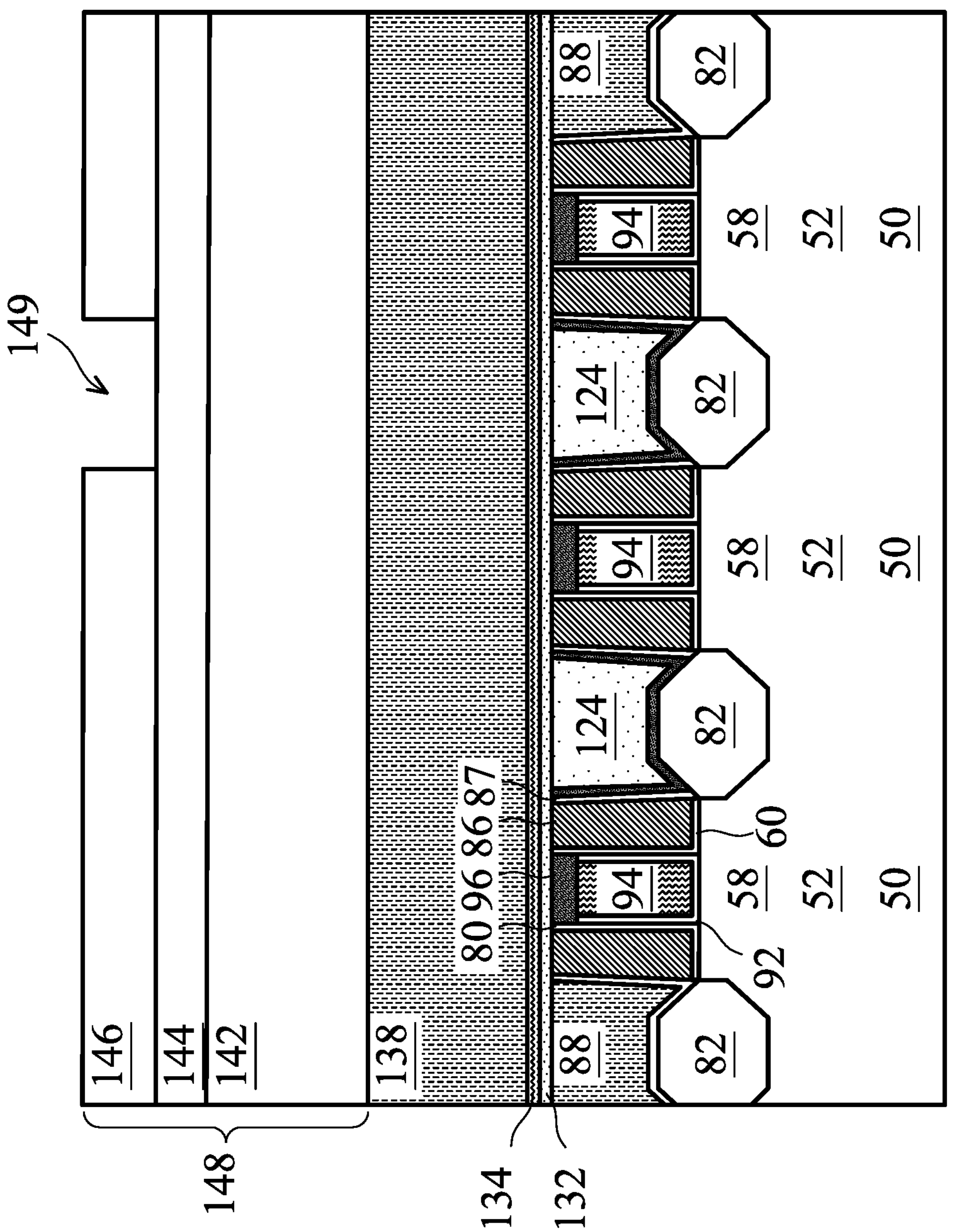

FIGS. 9 through 15 illustrate a process for forming a conductive plug to contact the self-aligned source/drain contacts 124. This process corresponds to element 285 in the flow diagram 200 of FIG. 24. In FIG. 9, a tri-layer photo mask 148 is formed over the second ILD 138. The tri-layer photo mask 148 includes a bottom layer 142 (sometimes referred to as an under layer), a middle layer 144 over the bottom layer 142, and an upper layer 146 over the middle layer 144. In accordance with some embodiments of the present disclosure, the bottom layer 142 and the upper layer 146 are formed of photo resists, which are formed of organic materials. The under layer 142 may have anti-reflective properties and may be a nitrogen free anti-reflective coating. The middle layer 144 may be formed of an inorganic material, which may be a nitride (such as silicon nitride), an oxynitride (such as silicon oxynitride), an oxide (such as silicon oxide), or the like. The middle layer 144 has a high etching selectivity with relative to the upper layer 146 and the bottom layer 142, and hence the upper layer 146 is used as an etching mask for the patterning of the middle layer 144, and the middle layer 144 is used as an etching mask for the patterning of the bottom layer 142. After photo mask 148 is formed, the upper layer 146 is patterned in a photo lithography process to form openings 149.

Figure 10:
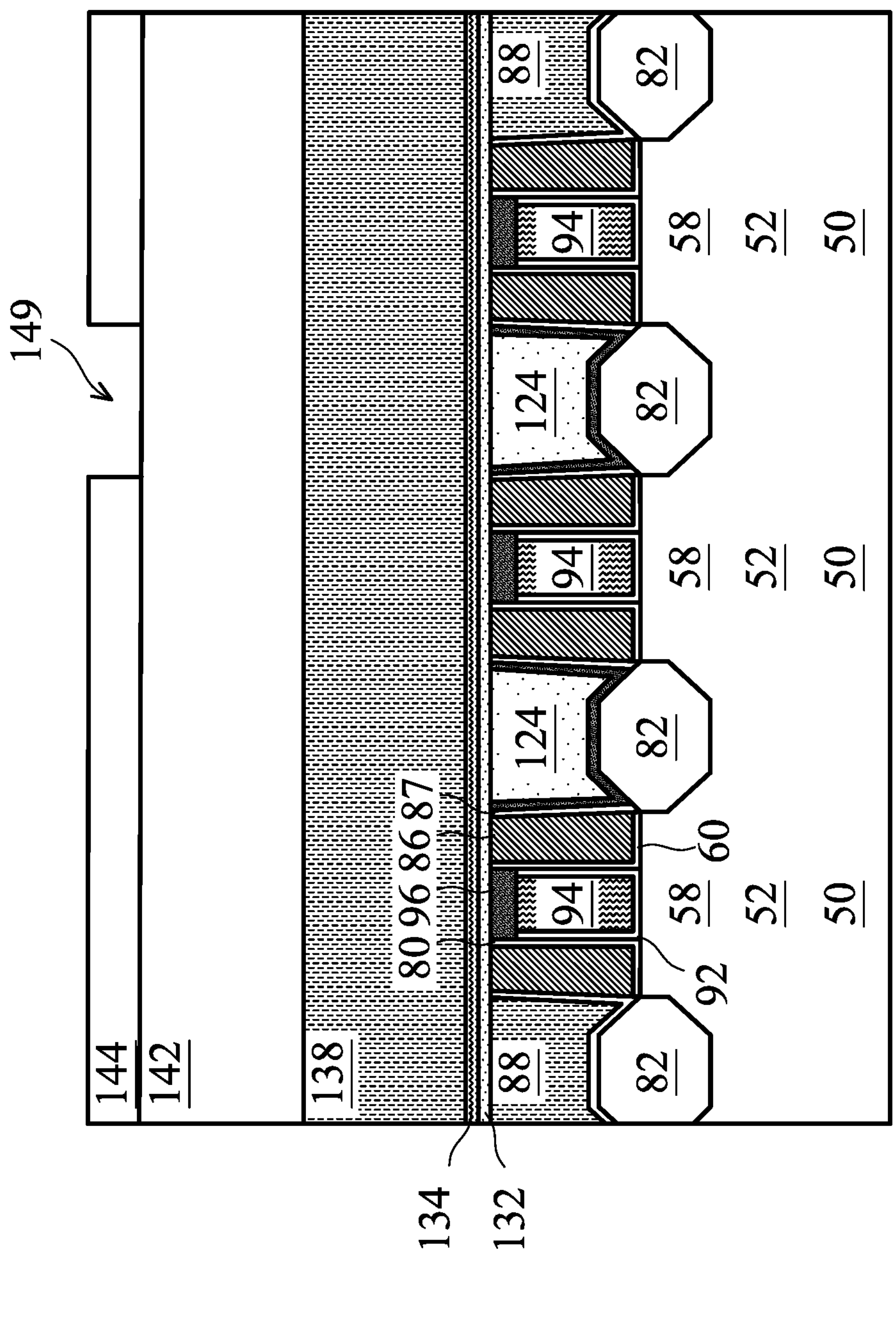

In FIG. 10, the patterned upper layer 146 is then used to pattern the middle layer 144 by extending the openings 149 in upper layer 146 into the middle layer 144 by an etching process while using the upper layer 146 as an etch mask. The upper layer 146 may be consumed in the process and, if not, after the middle layer 144 is patterned, the upper layer 146 may be removed by a cleaning process.

Figure 11:
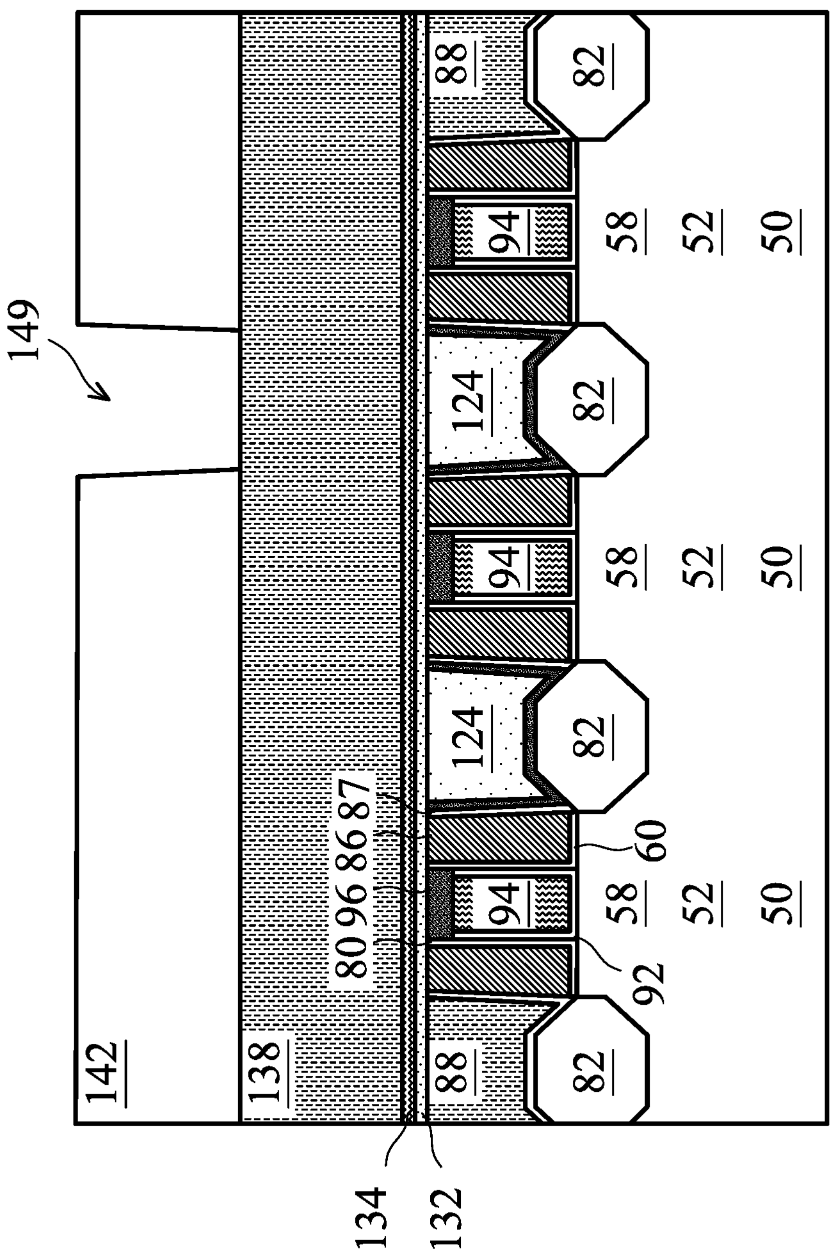

In FIG. 11, the patterned middle layer 144 is then used to pattern the bottom layer 142 by extending the openings 149 in the middle layer 144 into the bottom layer 142 by an etching process while using the middle layer 144 as an etch mask. The middle layer 144 may be consumed in the process and, if not, after the bottom layer 142 is patterned, the middle layer 144 may be removed by a cleaning process.

Figure 12:
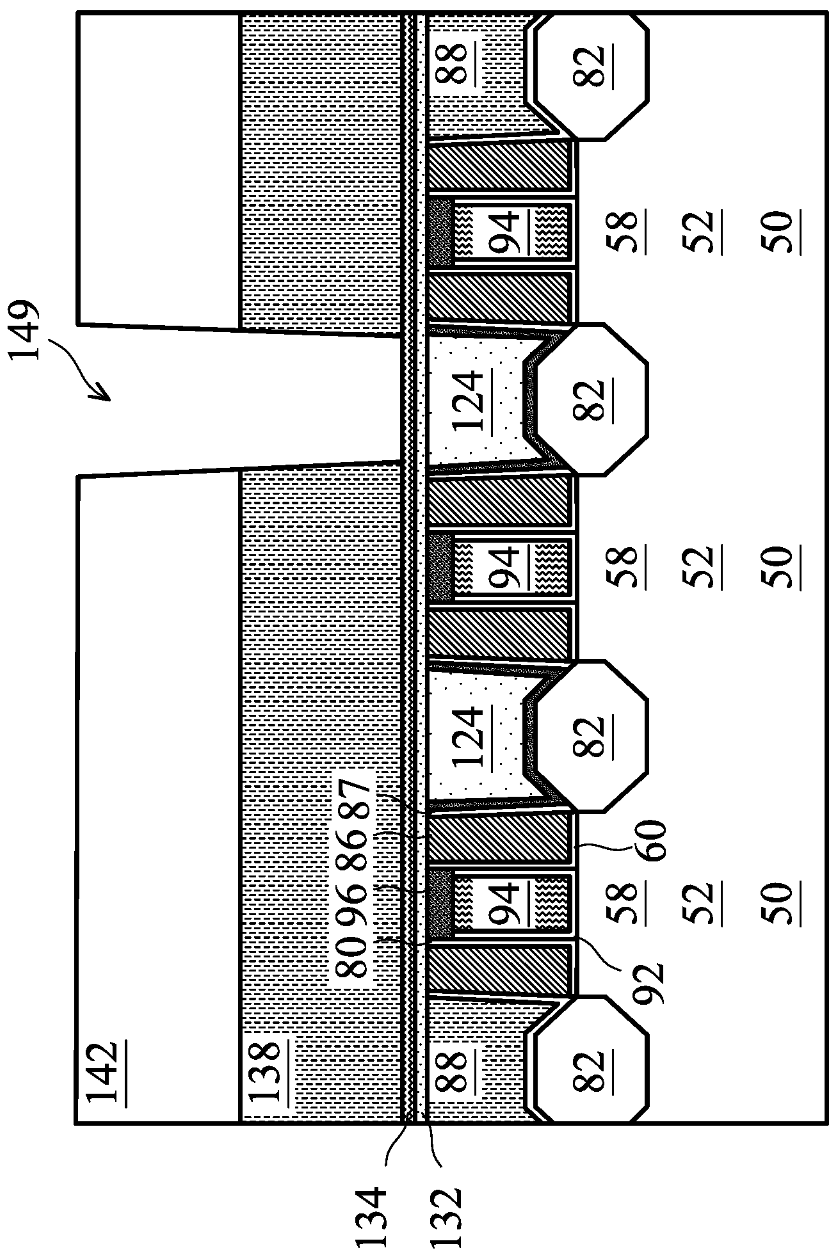

In FIG. 12, the bottom layer 142 is then used to pattern the second ILD 138 by extending the openings 149 into the second ILD 138 by an etching process while using the bottom layer 142 as a mask. The second ILD 138 may be etched using a dry etch process (plasma etch). Where a dry etch is used, example etchants for etching the second ILD 138 may include a fluorine reactive gas, such as, a carbon-fluoro-based etchant ($C_xF_y$), $NF_3$, or the like. Other process gases may be used in combination with the carbon-fluoro-based etchants, such as, oxygen ($O_2$), nitrogen ($N_2$), argon (Ar), combinations thereof, or the like. The ESL 134 may be used as an etch stop.

Figure 13:
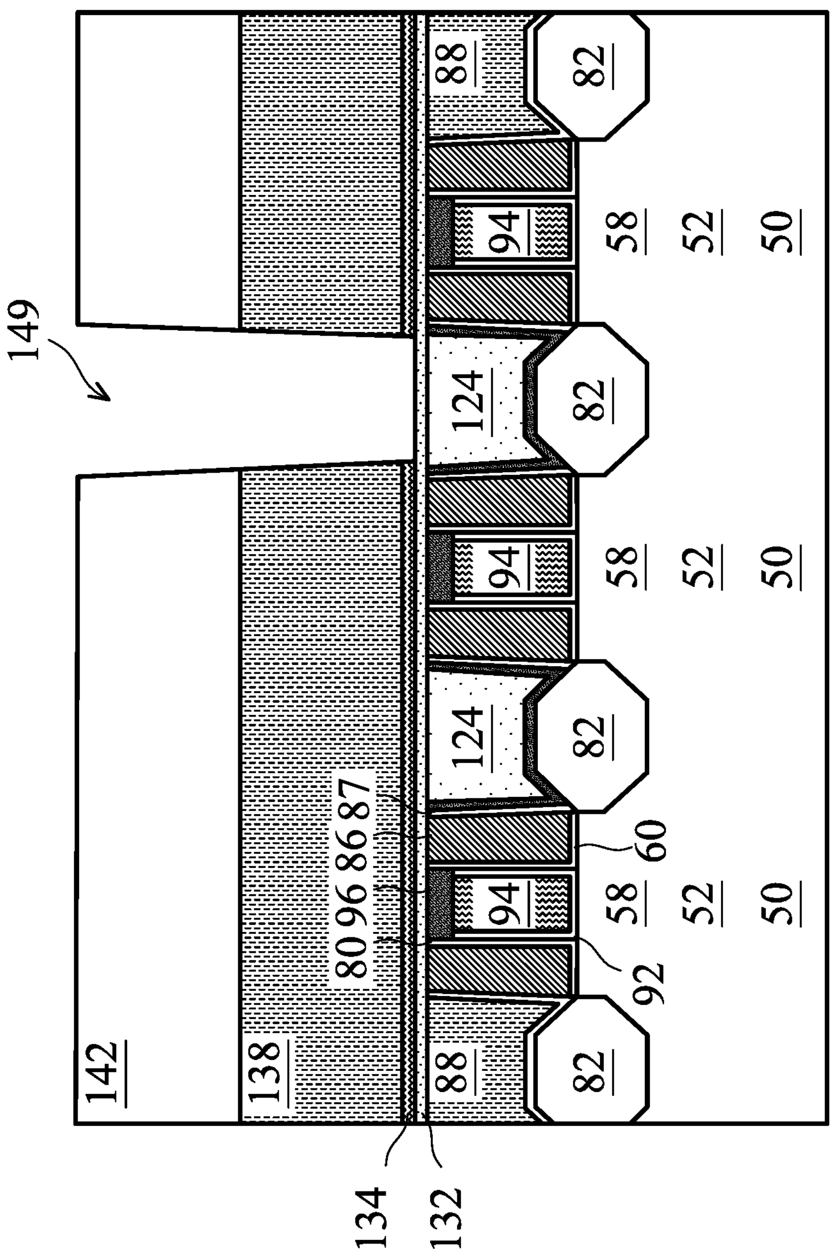

In FIG. 13, after etching the second ILD 138, rather than removing the bottom layer 142, the bottom layer 142 is maintained in place for the etching of the ESL 134 and the dielectric layer 132. The bottom layer 142 provides protection for the second ILD 138 so that further processing of the second ILD 138 to restore or level the second ILD 138 can be avoided. Also, in some embodiments, other features, such as other conductive plugs, isolation regions, or other metal features, may be formed in the second ILD 138. In such embodiments, these features may be protected by the bottom layer 142.

The ESL 134 is etched by a wet etch process to break through the ESL 134. If the bottom layer 142 were removed, the wet etch process may damage the second ILD 138. The ESL 134 may be etched using deionized water (DI), DI blended with carbon dioxide ($CO_2$), DI blended with ozone ($O_3$), DI blended with hydrogen peroxide ($H_2O_2$) (where a ratio of DI to $H_2O_2$ is between 5:1 and 30:1), DI blended with ammonia ($NH_4OH$) (where a ratio of DI to $NH_4OH$ is between 5:1 and 2000:1), and Standard Clean 1 (SC1). The SC1 solution may comprise $NH_4OH$, $H_2O_2$, and $H_2O$ (where a ratio of $NH_4OH$ to $H_2O_2$ to $H_2O$ is between 1:1:5 and 1:1:400). The etching may take between 30 sec and 300 sec at a process temperature between about 20° C. and about 65° C. Following the etching, the openings 149 may be rinsed and dried using isopropyl alcohol and/or acetone.

Figure 14:
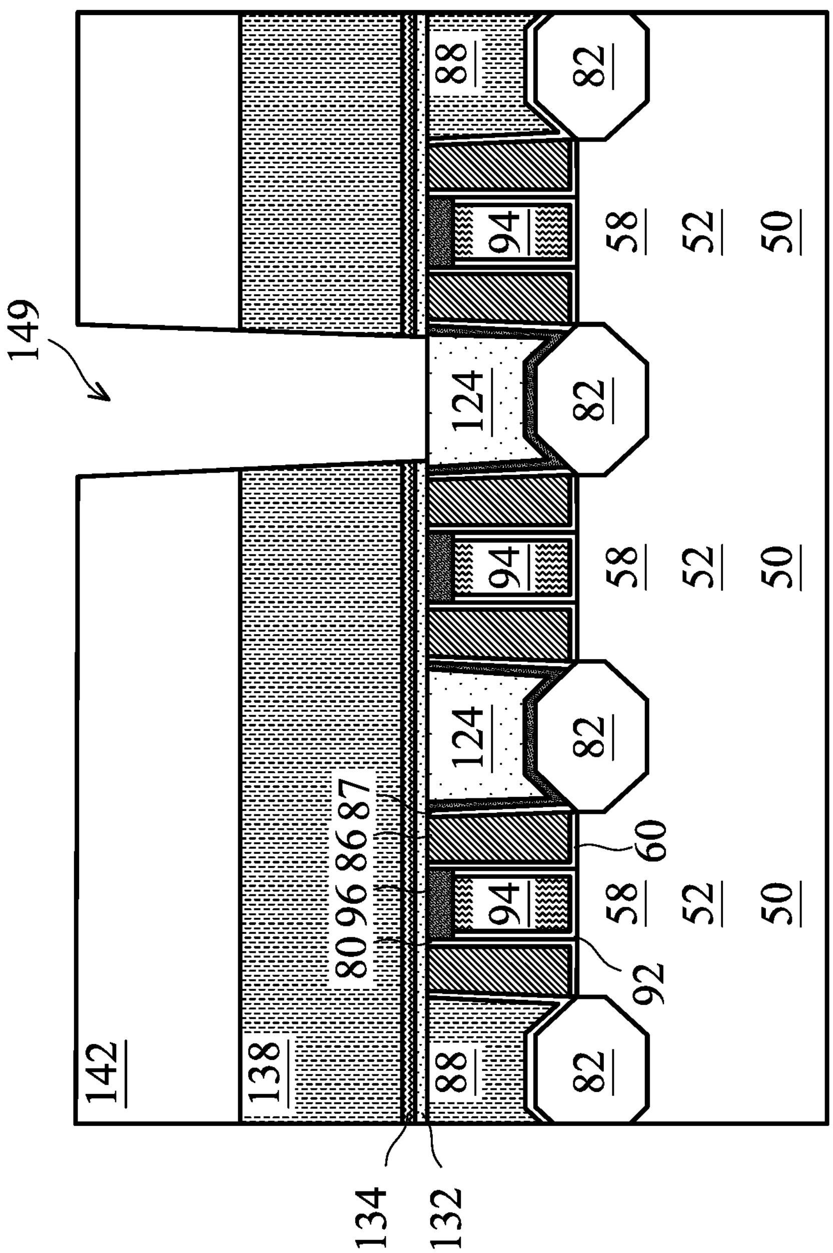

In FIG. 14, after etching the ESL 134, while the bottom layer 142 is still over the second ILD 138, the dielectric layer 132 may be etched to extend the openings 149 into the dielectric layer 132. The dielectric layer 132 may be etched using any suitable process such as by a dry etch process using any suitable etchant, such as a fluorine reactive gas, such as, a carbon-fluoro-based etchant ($C_xF_y$), $NF_3$, or the like. The etching exposes the self-aligned source/drain contacts 124.

Figure 15:
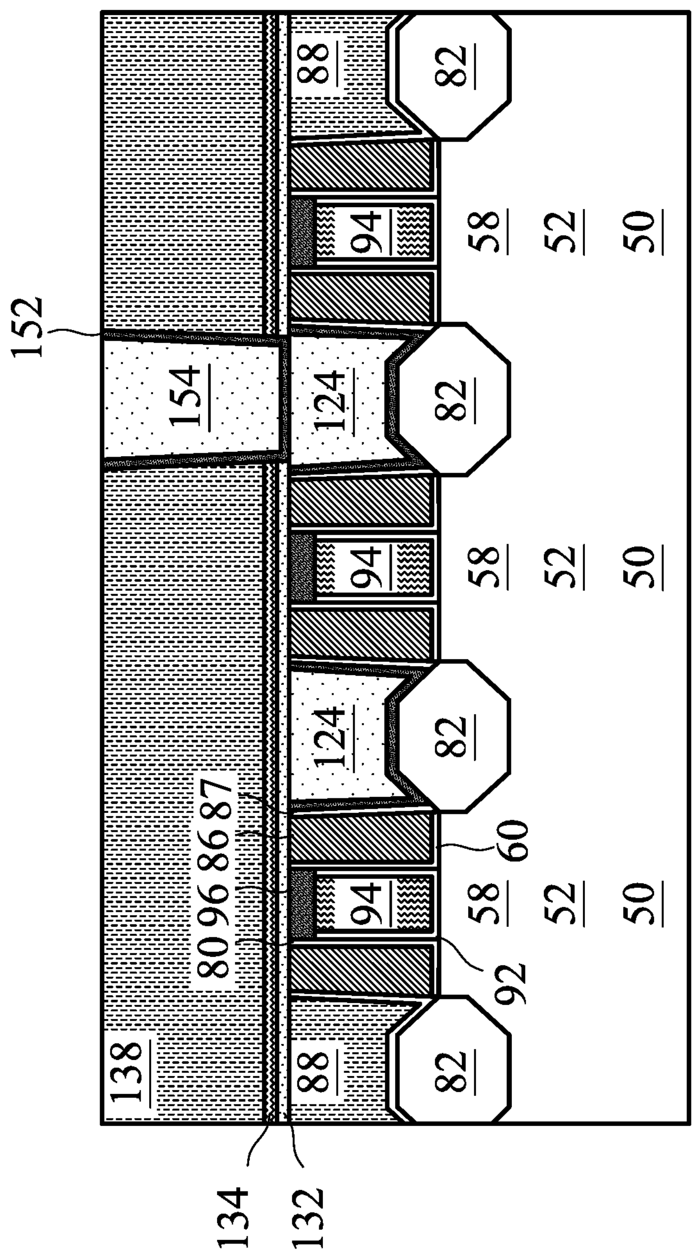

In FIG. 15, the bottom layer 142 may be removed by any suitable technique, such as by an ashing process using a remote plasma including nitrogen, hydrogen, or oxygen. The openings 149 are filled with a liner 152, such as a diffusion barrier layer, an adhesion layer, or the like, and a conductive material. The liner 152 may include titanium, titanium nitride, tantalum, tantalum nitride, or the like formed by ALD, CVD, or the like. The conductive material may be copper, a copper alloy, silver, gold, tungsten, cobalt, aluminum, nickel, titanium, tantalum, alloys thereof, combinations thereof, or the like, but other suitable metal may be used. A planarization process, such as a CMP, may be performed to remove excess material from a surface of the second ILD 138 and level an upper surface of the second ILD 138 with an upper surface of the liner 152 and of the conductive material, thereby forming conductive plug 154.

Figure 16:
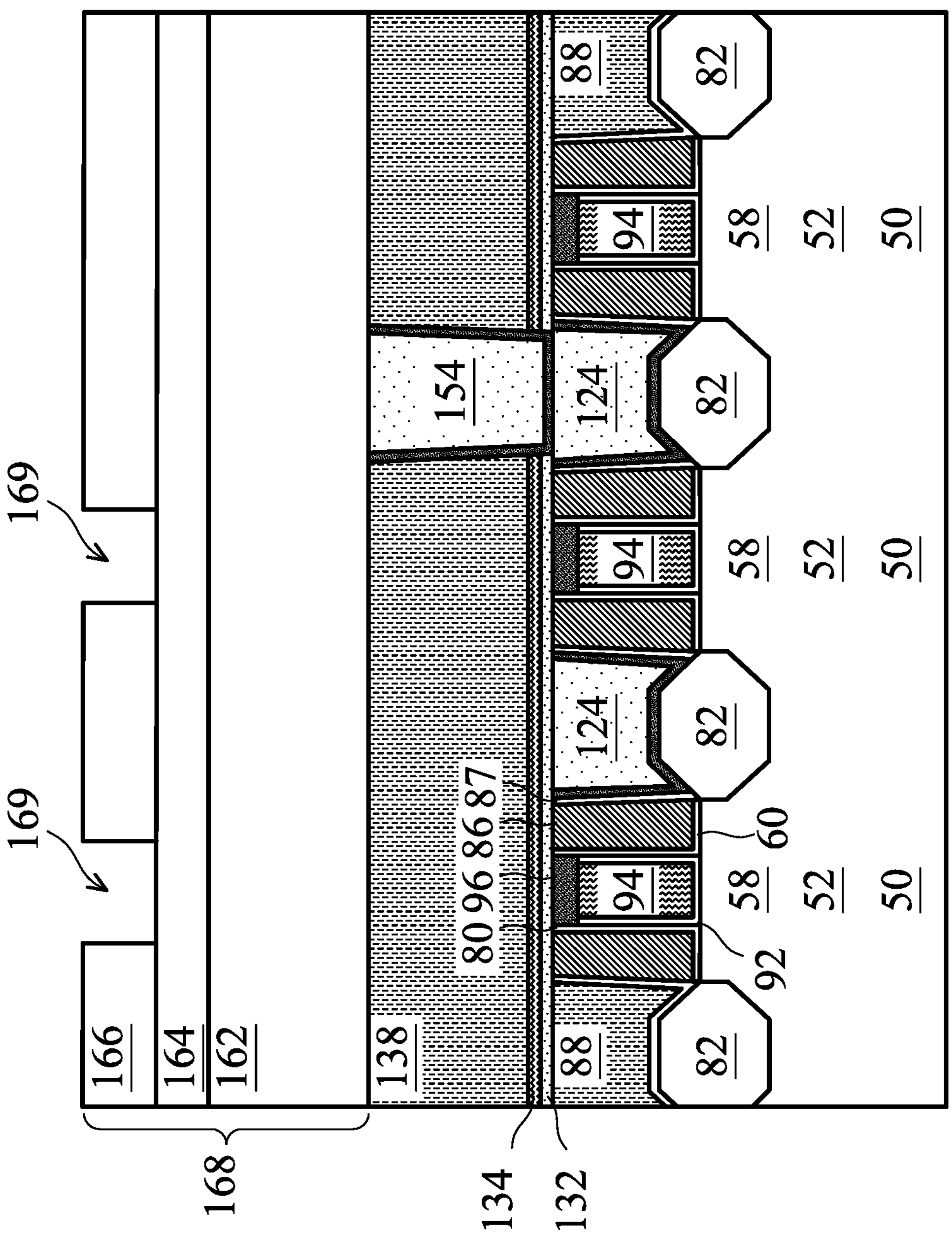

FIGS. 16 through 23 illustrate a process for forming gate contacts to contact the gate electrodes 94. This process corresponds to element 290 in the flow diagram 200 of FIG. 24. Although shown as being formed in the same cross-section, it should be appreciated that each of the conductive plugs 154 and gate contacts 174 (see FIG. 23) may be formed in different cross-sections, which may avoid shorting of the contacts. In FIG. 16, a tri-layer photo mask 168 is formed over the second ILD 138. The tri-layer photo mask 168 includes a bottom layer 162 (sometimes referred to as an under layer), a middle layer 164 over the bottom layer 162, and an upper layer 166 over the middle layer 164. The tri-layer photo mask 168 may be formed using similar processes and materials as the tri-layer photo mask 148 of FIG. 9. The upper layer 166 patterned in a photo lithography process to form openings 169.

Figure 17:
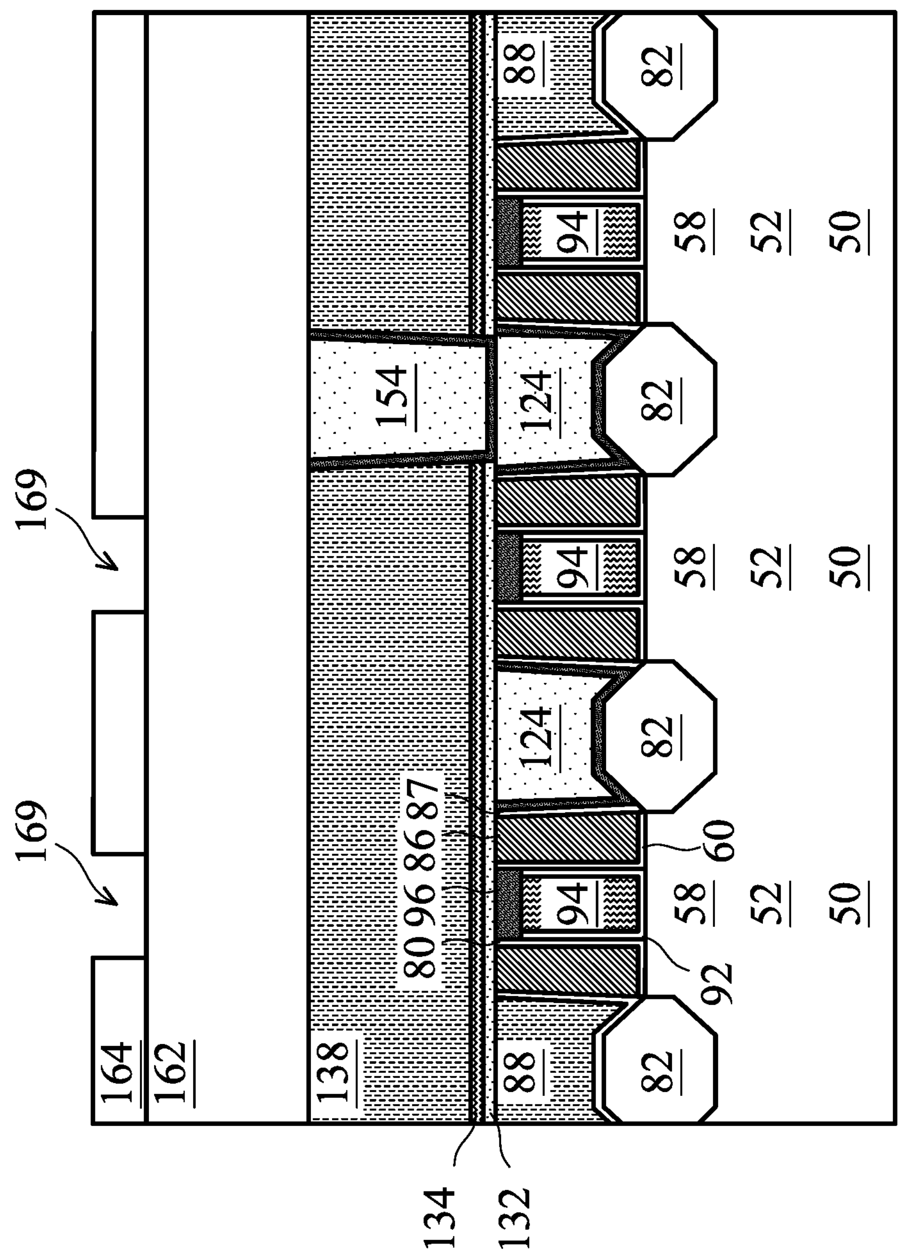

In FIG. 17, the patterned upper layer 166 is then used to pattern the middle layer 164 by extending the openings 169 in upper layer 166 into the middle layer 164 by an etching process while using the upper layer 166 as an etch mask. The upper layer 166 may be consumed in the process and, if not, after the middle layer 164 is patterned, the upper layer 166 may be removed by a cleaning process.

Figure 18:
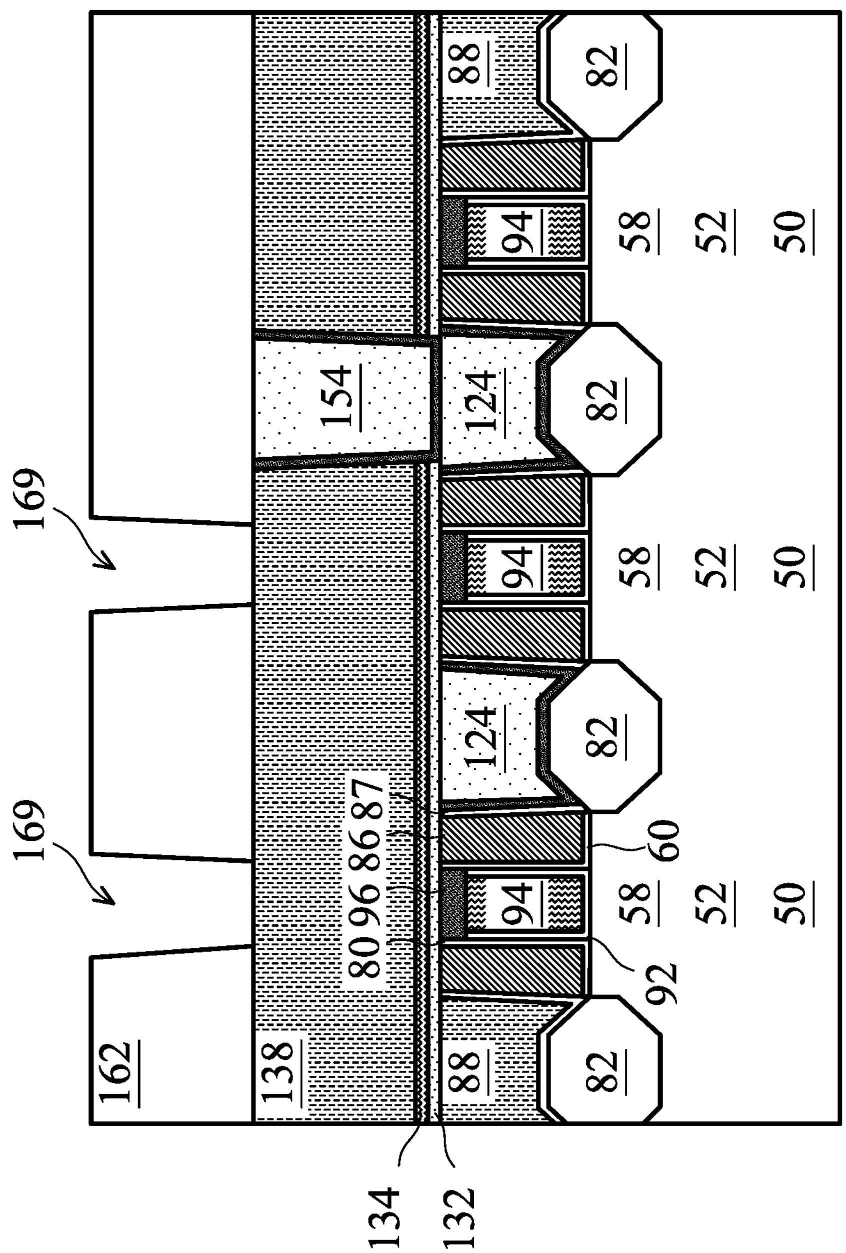

In FIG. 18, the patterned middle layer 164 is then used to pattern the bottom layer 162 by extending the openings 169 in the middle layer 164 into the bottom layer 162 by an etching process while using the middle layer 164 as an etch mask. The middle layer 164 may be consumed in the process and, if not, after the bottom layer 162 is patterned, the middle layer 164 may be removed by a cleaning process.

Figure 19:
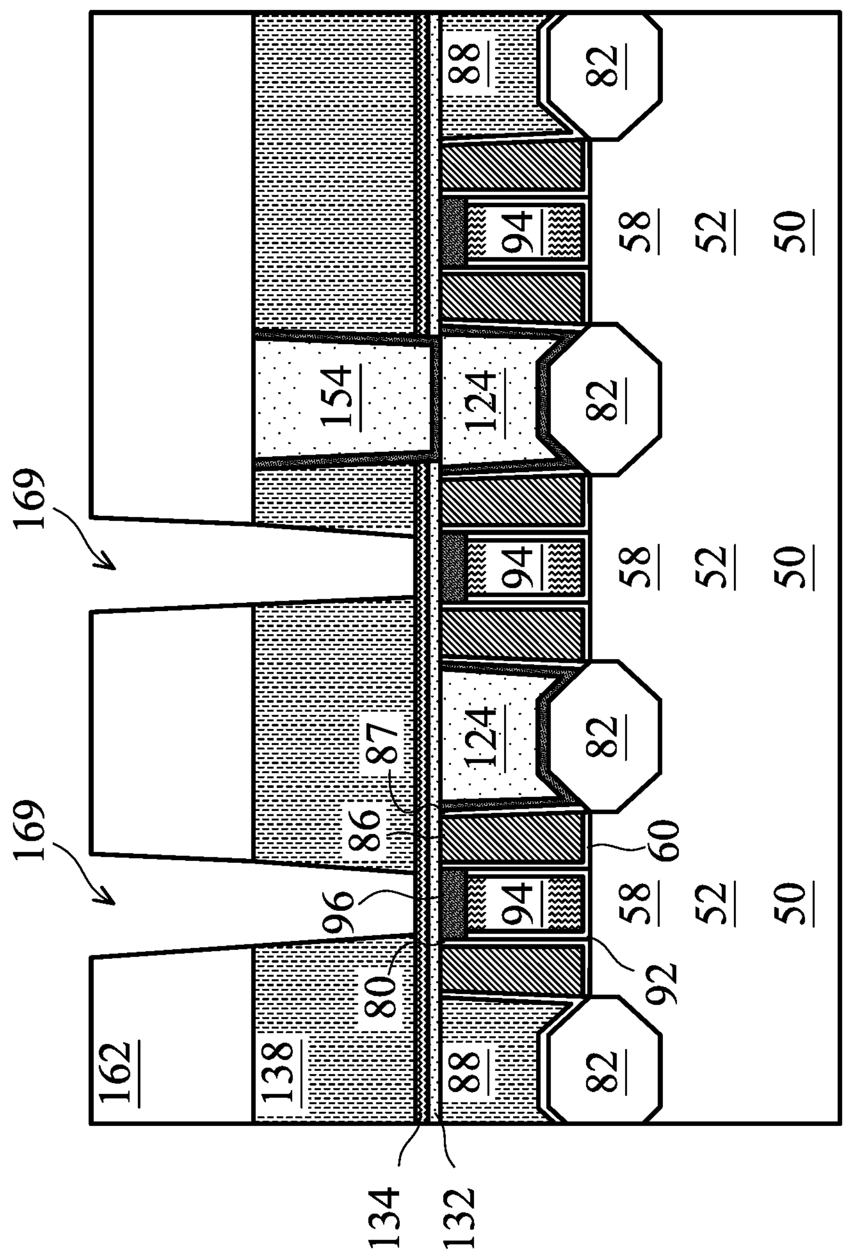

In FIG. 19, the bottom layer 162 is then used to pattern the second ILD 138 by extending the openings 169 into the second ILD 138 by an etching process while using the bottom layer 168 as a mask. The second ILD 138 may be etched using a dry etch process (plasma etch) using materials such as those discussed above with respect to FIG. 12. The ESL 134 may be used as an etch stop.

Figure 20:
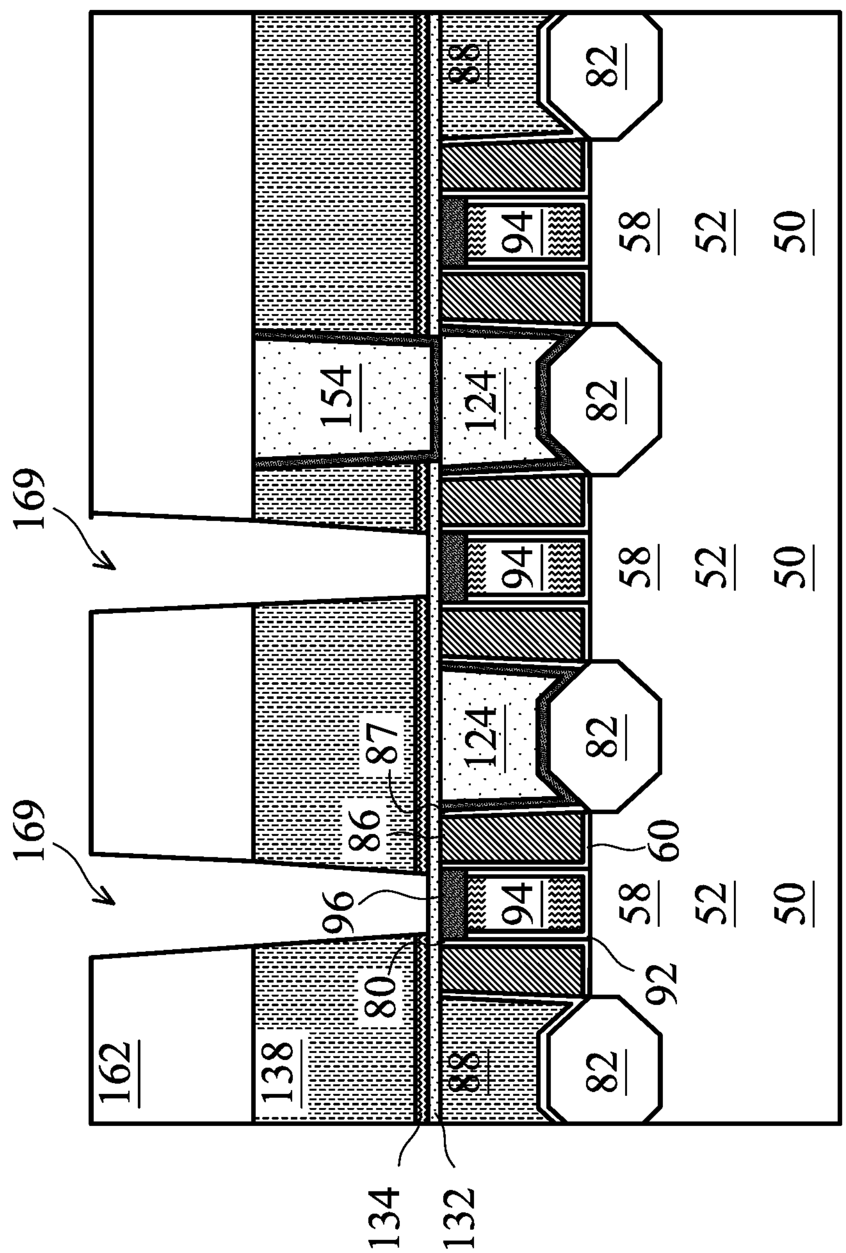

In FIG. 20, after etching the second ILD 138, rather than removing the bottom layer 162, the bottom layer 162 is maintained in place for the etching of the ESL 134 and the dielectric layer 132. The bottom layer 162 provides protection for the second ILD 138 so that further processing of the second ILD 138 to restore or level the second ILD 138 can be avoided. The bottom layer 162 also provides protection for the conductive plug 154, which is already formed in the second ILD 138. Also, in some embodiments, other features may be formed in the second ILD 138. In such embodiments, these other features may also be protected by the bottom layer 162.

The ESL 134 is etched by a wet etch process to break through the ESL 134. If the bottom layer 142 were removed, the wet etch process may damage the second ILD 138 and the conductive plug 154. The ESL 134 may be etched using processes and materials such as those discussed above with respect to FIG. 13.

Figure 21:
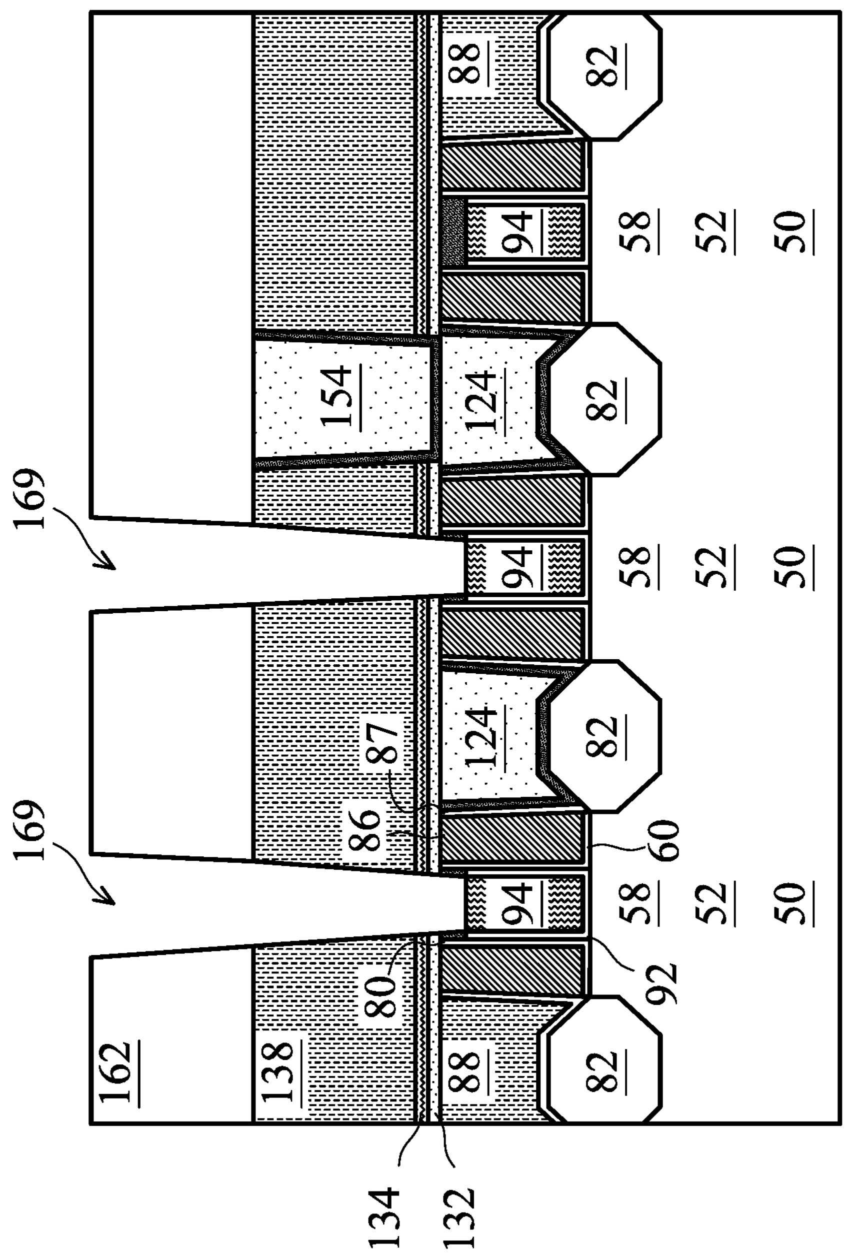

In FIG. 21, after etching the ESL 134, while the bottom layer 142 is still over the second ILD 138, the dielectric layer 132 may be etched to extend the openings 149 into the dielectric layer 132 and into the gate mask 96. The dielectric layer 132 may be etched using any suitable process such as by a dry etch process using any suitable etchant, such as a fluorine reactive gas, such as, a carbon-fluoro-based etchant ($C_xF_y$), $NF_3$, or the like. In some embodiments the gate mask 96 is the same material as the dielectric layer 132 and in other embodiments they are different. In such embodiments, the etchants used can be modified as appropriate to etch each respective material of the dielectric layer 132 and the gate mask 96. The etching exposes the gate electrode 94.

Figure 22:
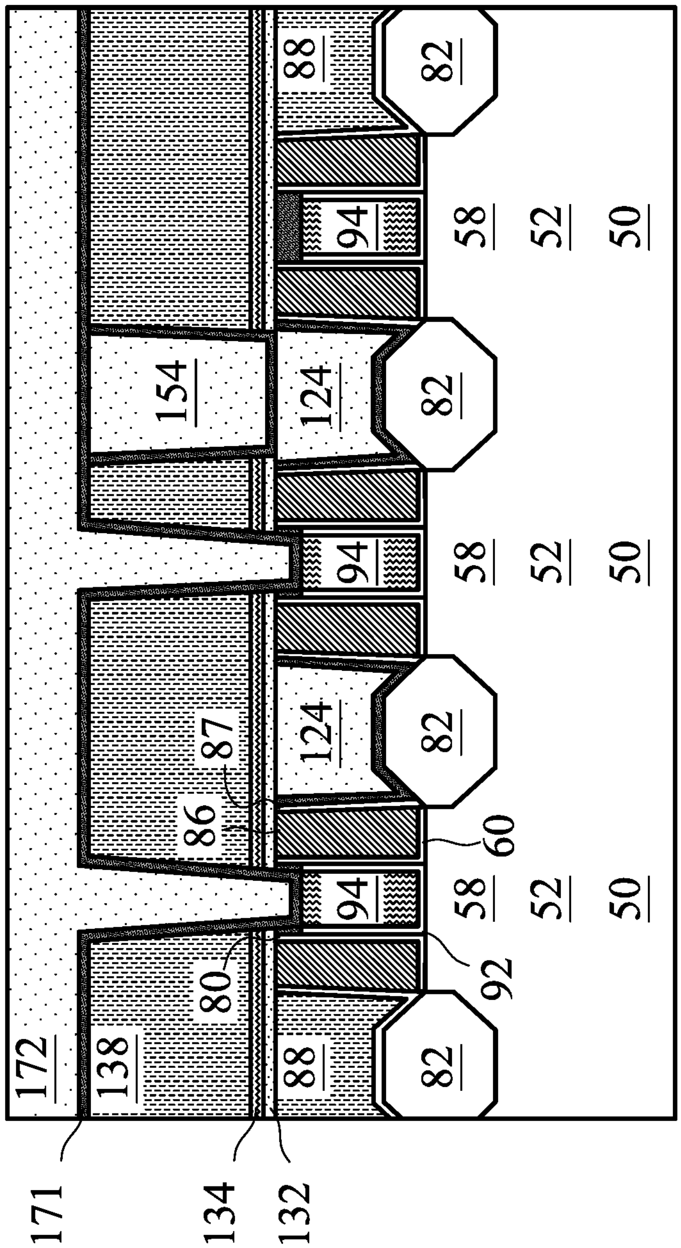

In FIG. 22, the bottom layer 162 may be removed by any suitable technique, such as by an ashing process using a remote plasma including nitrogen, hydrogen, or oxygen. The openings 169 are filled with a liner 171, such as a diffusion barrier layer, an adhesion layer, or the like, and a conductive material 172. The liner 171 may include titanium, titanium nitride, tantalum, tantalum nitride, or the like formed by ALD, CVD, or the like. The conductive material 172 may be copper, a copper alloy, silver, gold, tungsten, cobalt, aluminum, nickel, titanium, tantalum, alloys thereof, combinations thereof, or the like, but other suitable metal may be used.

Figure 23:
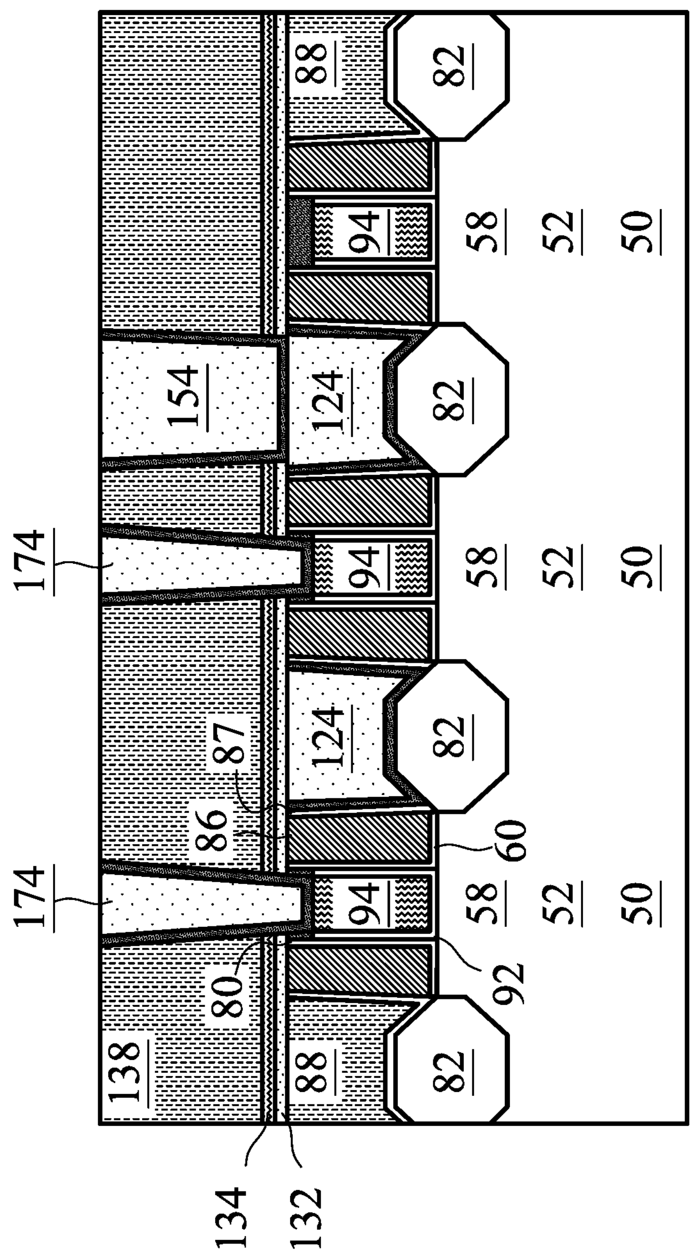
Figure 24:
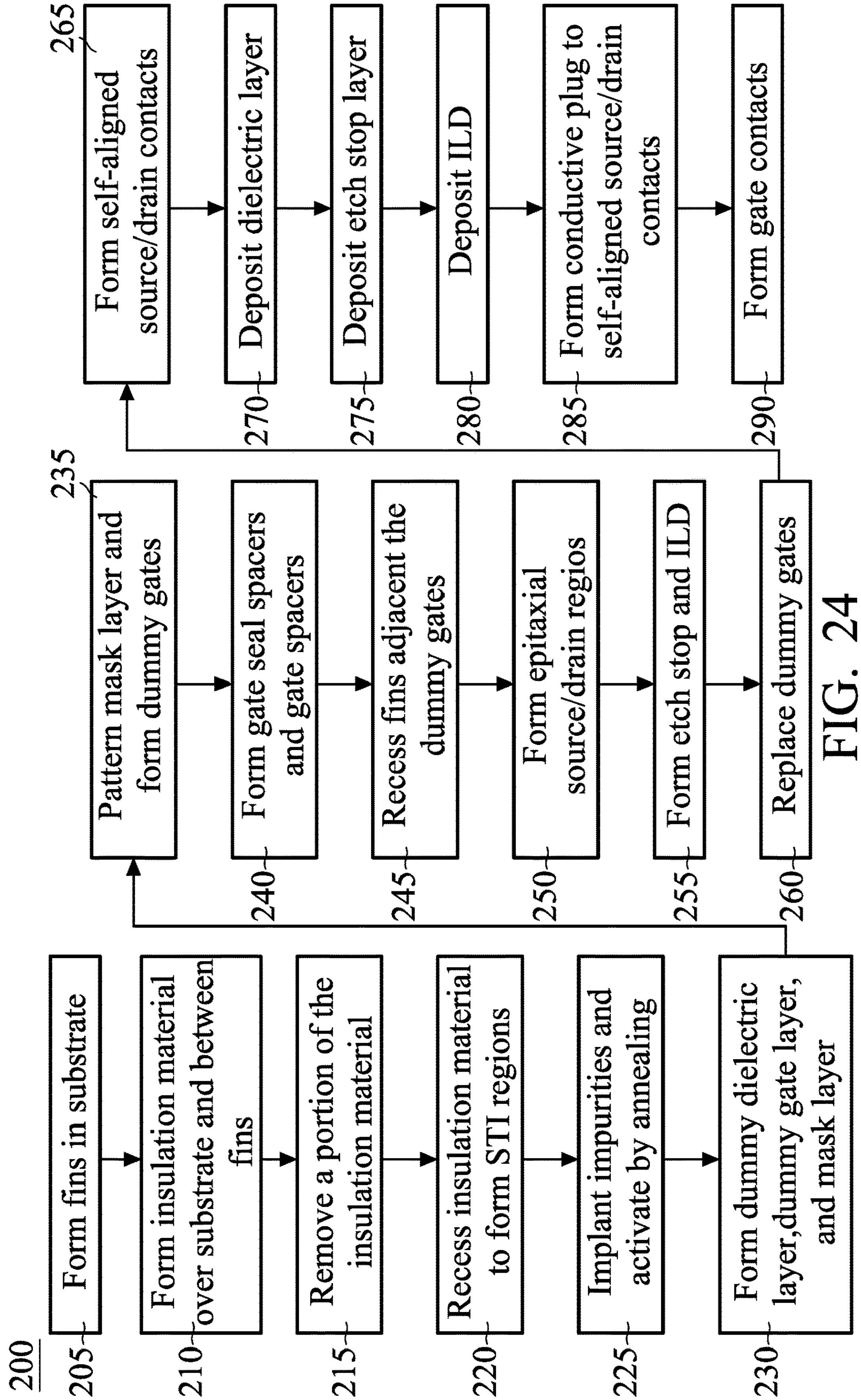
FIG. 24 is a flow diagram of a process of manufacturing a FinFET, in accordance with some embodiments.

In FIG. 23, a planarization process, such as a CMP, may be performed to remove excess material of the liner 171 and the conductive material 172 from a surface of the second ILD 138 and level an upper surface of the second ILD 138 with an upper surface of the liner 171 and of the conductive material 172, thereby forming gate contacts 174.

The disclosed FinFET embodiments could also be applied to nanostructure devices such as nanostructure (e.g., nanosheet, nanowire, gate-all-around, or the like) field effect transistors (NSFETs). In an NSFET embodiment, the fins are replaced by nanostructures formed by patterning a stack of alternating layers of channel layers and sacrificial layers. Dummy gate stacks and source/drain regions are formed in a manner similar to the above-described embodiments. After the dummy gate stacks are removed, the sacrificial layers can be partially or fully removed in channel regions. The replacement gate structures are formed in a manner similar to the above-described embodiments, the replacement gate structures may partially or completely fill openings left by removing the sacrificial layers, and the replacement gate structures may partially or completely surround the channel layers in the channel regions of the NSFET devices. ILDs and contacts to the replacement gate structures and the source/drain regions may be formed in a manner similar to the above-described embodiments. A nanostructure device can be formed as disclosed in U.S. Patent Application Publication No. 2016/0365414, which is incorporated herein by reference in its entirety.

In other embodiments, these processes could be used in a back end of line (BEoL) process for handling post via etch cleaning or before metal plug. FIGS. 25 through 31 illustrate intermediate steps in the formation of a conductive element in a dielectric material layer of a structure 300, in accordance with some embodiments. In some embodiments, the process discussed with respect to FIGS. 25 through 31 may be used in the formation of an interconnect in a BEoL process, such as an interconnect over a die or a redistribution structure. In other embodiments, the process discussed with respect to FIGS. 25 through 31 may be used in the formation of a contact of a transistor, such as a FinFET transistor.

Figure 25:
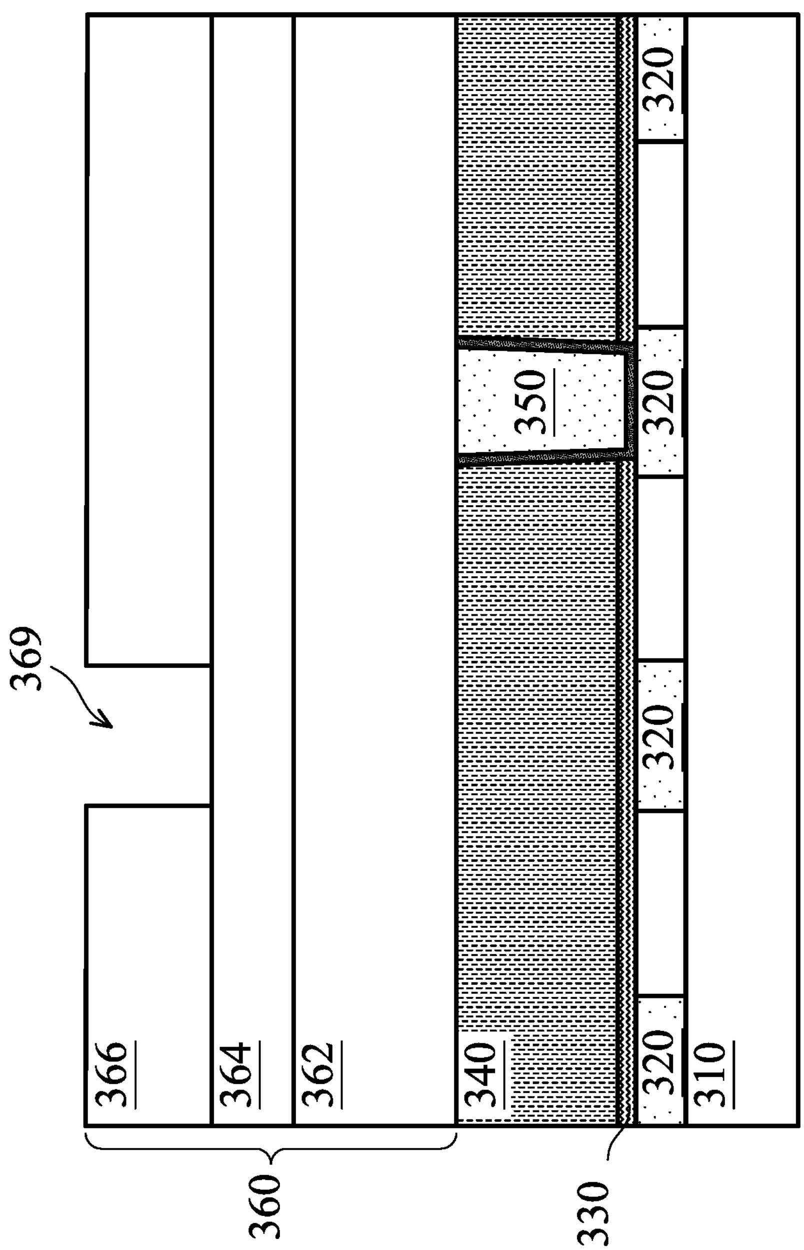
FIGS. 25 through 31 illustrate views of intermediate stages in a process of forming a conductive element in a dielectric layer, in accordance with some embodiments.

FIG. 25 illustrates a substrate 310 which may be part of a wafer. Substrate 310 may include different device regions that are singulated in subsequent steps to form a plurality of integrated circuit dies. Substrate 310 may comprise a semiconductor substrate, such as silicon, doped or undoped, or an active layer of a semiconductor-on-insulator (SOI) substrate. The substrate 310 may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GalnAs, GaInP, and/or GaInAsP; or combinations thereof. Other substrates, such as multi-layered or gradient substrates, may also be used.

In other embodiments, the substrate 310 may be an interposer and may include one or more substrate cores formed from a pre-impregnated composite fiber ("prepreg"), an insulating film or build-up film, paper, glass fiber, non-woven glass fabric, silicon, or the like. In yet other embodiments, the substrate 310 may be a carrier such as a glass carrier substrate, a ceramic carrier substrate, or the like. In some embodiments, substrate 310 includes multiple layers, for example, a carrier and a semiconductor substrate attached thereto with devices formed and embedded therein.

FIG. 25 also illustrates conductive features 320 embedded in the substrate 310. In some embodiments, the conductive features 320 may be formed in a separate layer over the substrate 310. The conductive features 320, for example, may correspond to contact pads of a die or metal features in a redistribution structure or interconnect. The conductive features 320 may be made of any suitable conductive material, such as solder, copper, aluminum, gold, nickel, silver, palladium, tin, the like, or a combination thereof.

FIG. 25 also illustrates an etch stop layer (ESL) 330 disposed over the conductive features 320. In some embodiments, the ESL 330 may be formed using processes and materials such as those discussed above with respect to FIG. 7. The ESL 330 may be deposited to a total thickness of between about 20 Å and about 40 Å, such as about 30 Å.

A dielectric material layer 340 is disposed over the ESL 330. The dielectric material layer 340 may correspond to an ILD or an inter-metal dielectric (IMD). The dielectric material layer 340 may include any suitable material, which may include a dielectric material having a low dielectric constant (k value) lower than 3.8, lower than about 3.0, or lower than about 2.5, for example, and conductive features, such as the conductive feature 105. The insulating material of substrate 100 may be formed of PSG, BSG, BPSG, USG, fluorine-doped silicate glass (FSG), tetraethyl orthosilicate (TEOS) formed silicon oxide, Black Diamond (a registered trademark of Applied Materials Inc.), a carbon-containing low-k dielectric material, Hydrogen SilsesQuioxane (HSQ), MethylSilsesQuioxane (MSQ), or the like. The dielectric material layer 340 may be selected so that it has an etch selectivity between the dielectric material layer and the ESL 330.

FIG. 25 also illustrates a conductive element 350 disposed in the dielectric material layer 340. The conductive element 350 may include a via, a conductive line, or an upper portion that is a conductive line and a lower portion that is a via. The conductive element 350 is electrically and physically coupled to the conductive feature 320. The conductive element 350 may be formed using processes and materials similar to those discussed above with respect to the conductive element 370 (see FIG. 30).

In FIG. 25, a tri-layer photo mask 360 is formed over the dielectric material layer 340. The tri-layer photo mask 360 includes a bottom layer 362 (sometimes referred to as an under layer), a middle layer 364 over the bottom layer 362, and an upper layer 366 over the middle layer 364. In accordance with some embodiments of the present disclosure, the bottom layer 362 and the upper layer 366 are formed of photo resists, which are formed of organic materials. The bottom layer 362 may have anti-reflective properties and may be a nitrogen free anti-reflective coating. The middle layer 364 may be formed of an inorganic material, which may be a nitride (such as silicon nitride), an oxynitride (such as silicon oxynitride), an oxide (such as silicon oxide), or the like. The middle layer 364 has a high etching selectivity with relative to the upper layer 366 and the bottom layer 362, and hence the upper layer 366 is used as an etching mask for the patterning of the middle layer 364, and the middle layer 364 is used as an etching mask for the patterning of the bottom layer 362. After photo mask 368 is formed, the upper layer 366 is patterned in a photo lithography process to form openings 369.

Figure 26:
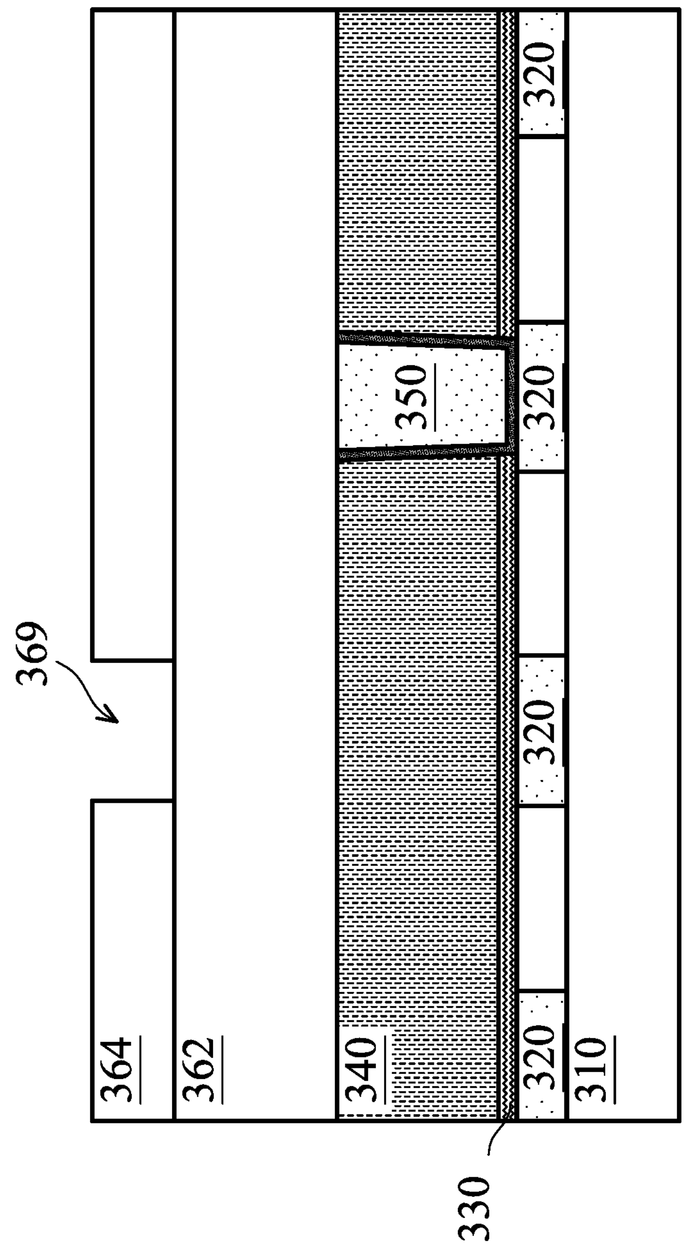

In FIG. 26, the patterned upper layer 366 is then used to pattern the middle layer 364 by extending the openings 369 in upper layer 366 into the middle layer 364 by an etching process while using the upper layer 366 as an etch mask. The upper layer 366 may be consumed in the process and, if not, after the middle layer 364 is patterned, the upper layer 366 may be removed by a cleaning process.

Figure 27:
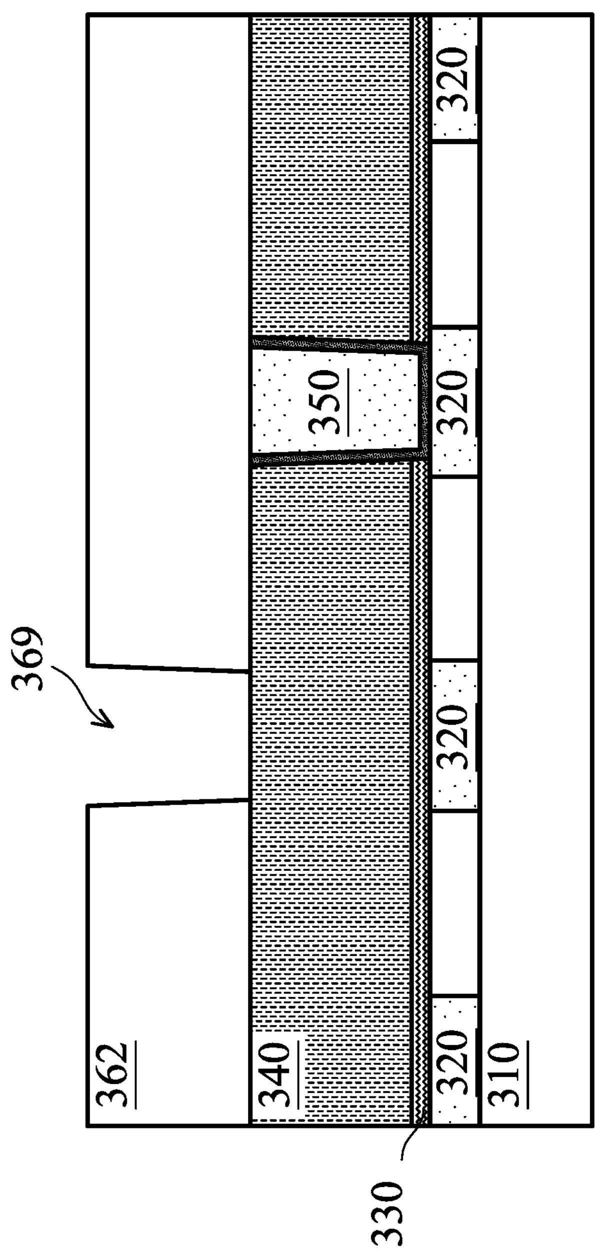

In FIG. 27, the patterned middle layer 264 is then used to pattern the bottom layer 362 by extending the openings 369 in the middle layer 364 into the bottom layer 362 by an etching process while using the middle layer 364 as an etch mask. The middle layer 364 may be consumed in the process and, if not, after the under layer 362 is patterned, the middle layer 364 may be removed by a cleaning process.

Figure 28:
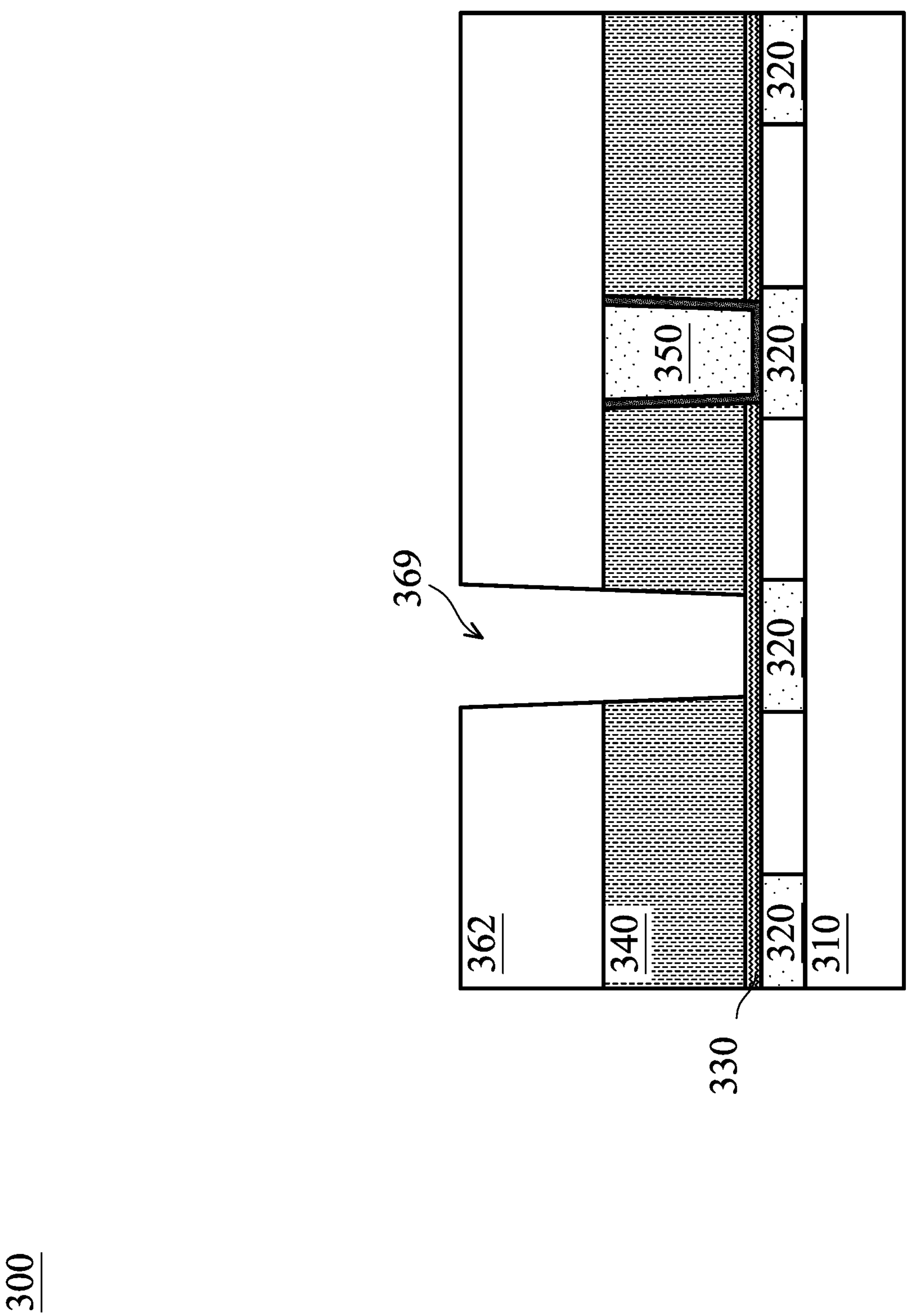

In FIG. 28, the bottom layer 362 is then used to pattern the dielectric material layer 340 by extending the openings 369 into the dielectric material layer 340 by an etching process while using the bottom layer 362 as a mask. The dielectric material layer 340 may be etched using a dry etch process (plasma etch). Where a dry etch is used, example etchants for etching the second ILD 138 may include a fluorine reactive gas, such as, a carbon-fluoro-based etchant ($C_xF_y$), $NF_3$, or the like. Other process gases may be used in combination with the carbon-fluoro-based etchants, such as, oxygen ($O_2$), nitrogen ($N_2$), argon (Ar), combinations thereof, or the like. The ESL 330 may be used as an etch stop.

Figure 29:
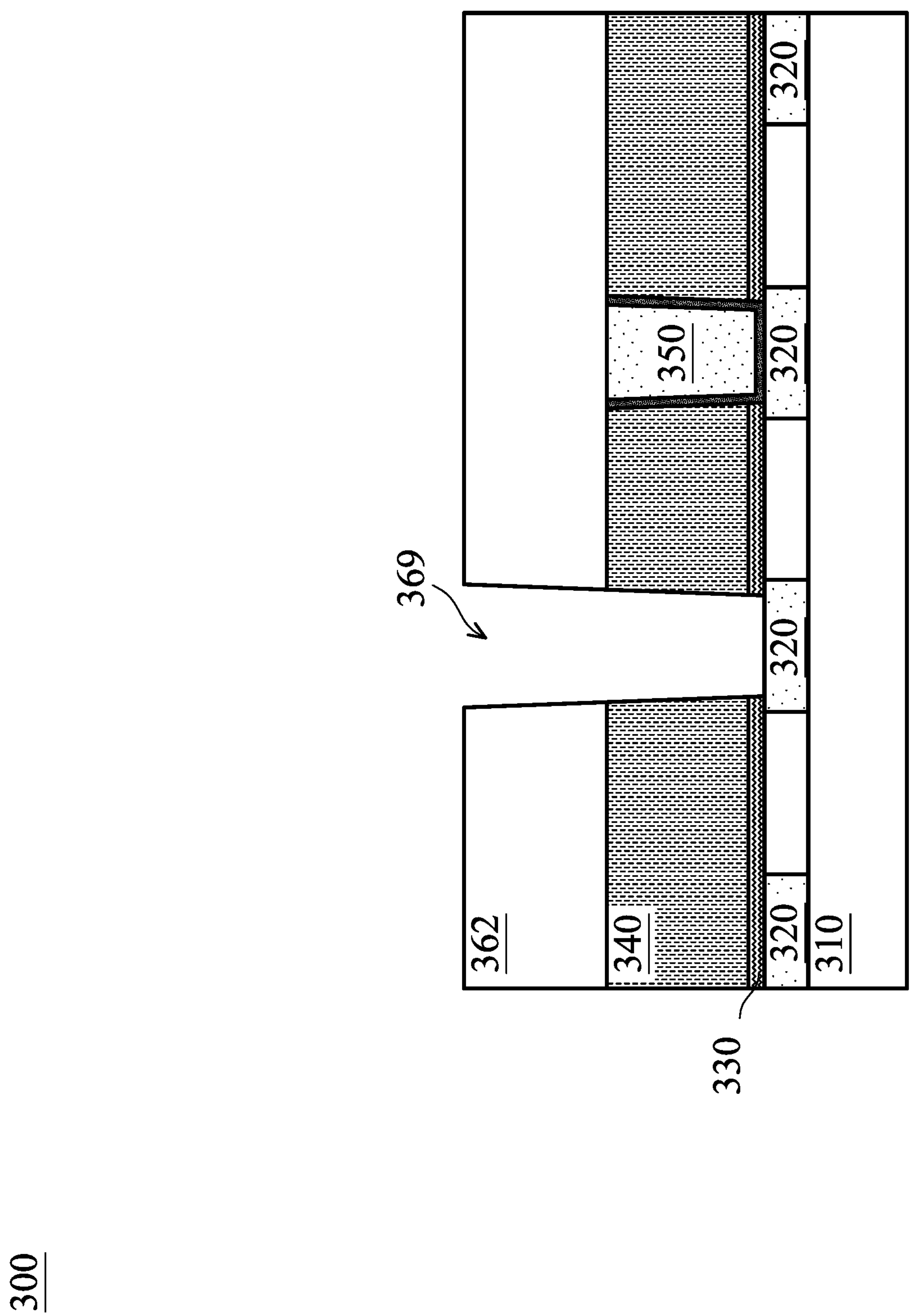

In FIG. 29, after etching the dielectric material layer 340, rather than removing the bottom layer 362, the bottom layer 362 is maintained in place for the etching of the ESL 330. The bottom layer 362 provides protection for the dielectric material layer 340 so that further processing of the dielectric material layer 340 to restore or level the dielectric material layer 340 can be avoided. Also, in embodiments where the conductive element 350 is formed in the dielectric material layer 340, the conductive element 350 may be protected by the bottom layer 362 during etching the ESL 330.

The ESL 330 is etched by a wet etch process to break through the ESL 330. If the bottom layer 362 were removed, the wet etch process may damage the dielectric material layer 340. The ESL 330 may be etched using deionized water (DI), DI blended with carbon dioxide ($CO_2$), DI blended with ozone ($O_3$), DI blended with hydrogen peroxide ($H_2O_2$) (where a ratio of DI to $H_2O_2$ is between 5:1 and 30:1), DI blended with ammonia ($NH_4OH$) (where a ratio of DI to $NH_4OH$ is between 5:1 and 2000:1), and Standard Clean 1 (SC1). The SC1 solution may comprise $NH_4OH$, $H_2O_2$, and $H_2O$ (where a ratio of $NH_4OH$ to $H_2O_2$ to $H_2O$ is between 1:1:5 and 1:1:400). The etching may take between 30 sec and 300 sec at a process temperature between about 20° C. and about 65° C. Following the etching, the openings 169 may be rinsed and dried using isopropyl alcohol and/or acetone.

Figure 30:
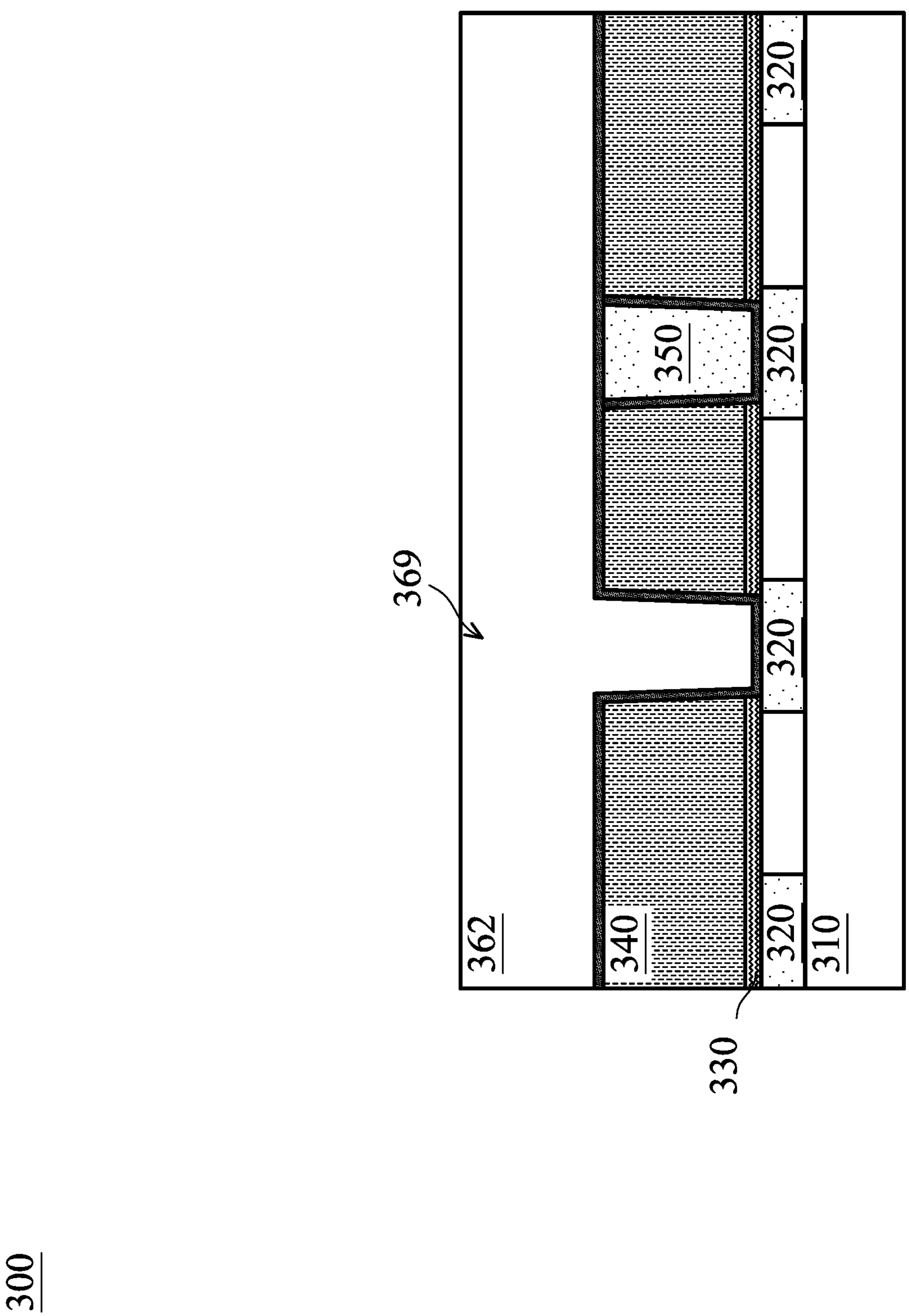

In FIG. 30, the bottom layer 362 may be removed by any suitable technique, such as by an ashing process using a remote plasma including nitrogen, hydrogen, or oxygen. The openings 369 are filled with a liner 372, such as a diffusion barrier layer, an adhesion layer, or the like, and a conductive material 374. The liner 372 may include titanium, titanium nitride, tantalum, tantalum nitride, or the like formed by ALD, CVD, or the like. The conductive material 374 may be copper, a copper alloy, silver, gold, tungsten, cobalt, aluminum, nickel, titanium, tantalum, alloys thereof, combinations thereof, or the like, but other suitable metal may be used.

Figure 31:
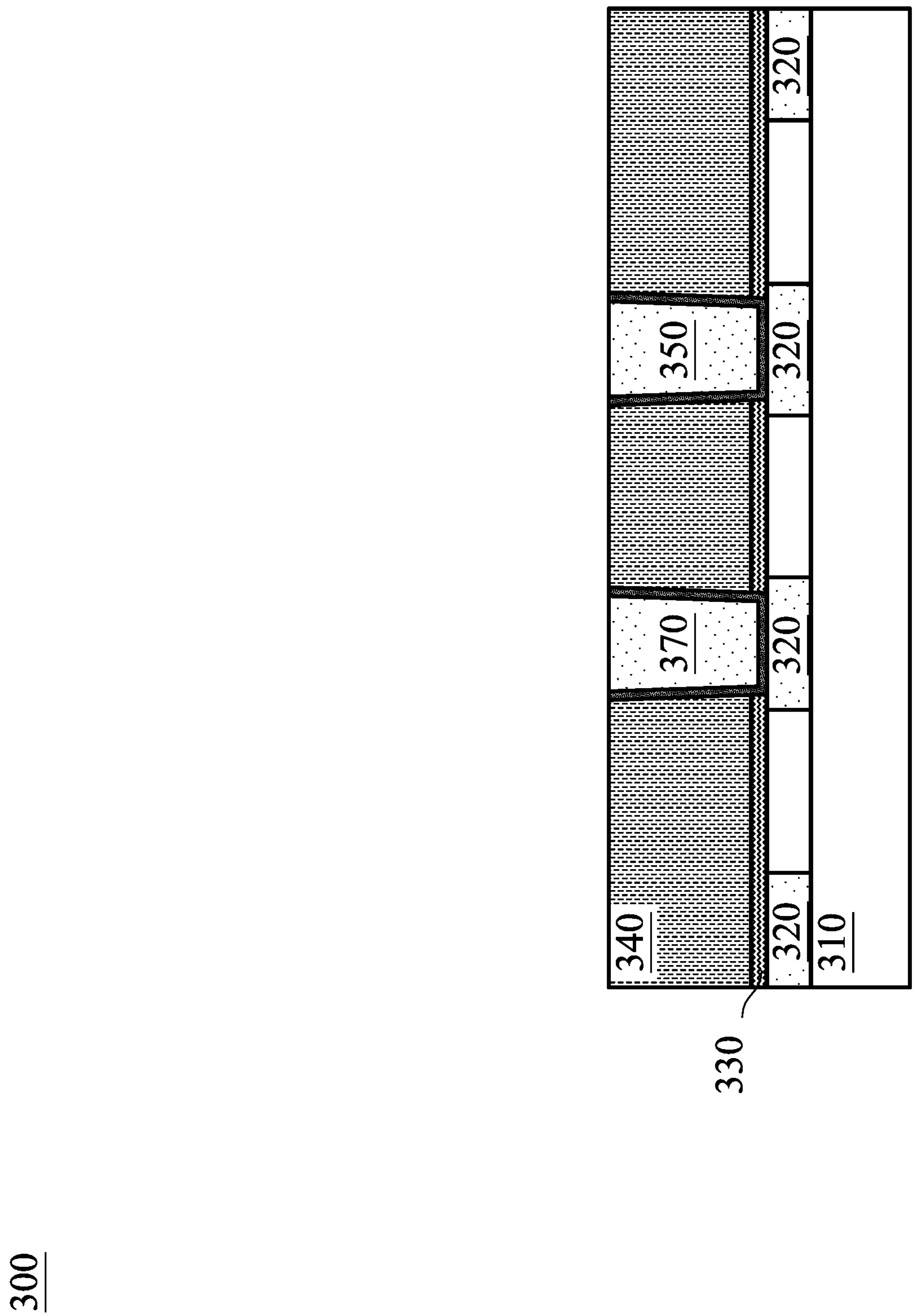

In FIG. 31, a planarization process, such as a CMP, may be performed to remove excess material from a surface of the dielectric material layer 340 and level an upper surface of the dielectric material layer 340 with an upper surface of the liner 372 and of the conductive material 374, thereby forming the conductive element 370. The conductive element 370 may be a conductive plug, a metal line, a metal via, a metal line with a metal via underneath, and the like.

Embodiments advantageously use a bottom layer of a photo-resist mask to protect a dielectric layer and conductive elements embedded in the dielectric layer when patterning an etch stop layer underlying the dielectric layer, rather than removing the bottom layer first. The bottom layer may further be used to also etch another dielectric layer underlying the etch stop layer, where etching the next dielectric layer exposes a contact, such as a gate contact. The bottom layer can be used to protect the conductive elements embedded in the dielectric layer from being damaged by a wet etchant used to etch the etch stop layer.

One embodiment is a method of breaking through an etch stop layer including patterning a photo resist layer, the photo resist layer overlying a dielectric layer. The dielectric layer is etched based on a pattern of the photo resist layer to form an opening in the dielectric layer, the etching stopping on an etch stop layer underlying the dielectric layer. While the photo resist layer is over the dielectric layer, the etch stop layer is etched to break through the etch stop layer. A conductive element is formed in the opening in the dielectric layer, the conductive element electrically coupled to a first metal feature underlying the etch stop layer.

Another embodiment is a method of breaking through an etch stop layer including forming a mask over a first dielectric layer. A first opening is formed in the mask, the first opening exposing a portion of the first dielectric layer. The first dielectric layer is etched while using the mask as an etch mask to form a second opening in the first dielectric layer, the second opening exposing an etch stop layer. The etch stop layer is etched while using the mask as an etch mask to form a third opening in the etch stop layer, the third opening exposing a second dielectric layer. The second dielectric layer is etched while using the mask as an etch mask to form a fourth opening in the second dielectric layer, the fourth opening exposing a conductive element. A first metal feature is formed in the first dielectric layer, the first metal feature electrically coupled to the conductive element.

Another embodiment is a method of breaking through an etch stop layer including forming a first metal feature in a first dielectric layer, the first metal feature electrically coupled to a source/drain contact of a transistor. A masking layer is deposited over the first dielectric layer and patterned. The first dielectric layer is patterned according to a pattern of the masking layer. An etch stop layer underlying the first dielectric layer is patterned according to the pattern of the masking layer while the masking layer is over the first dielectric layer. A second dielectric layer is patterned according to the pattern of the masking layer while the masking layer is over the first dielectric layer to expose a gate electrode of the transistor. A conductive plug is formed through the first dielectric layer and through the second dielectric layer, the conductive plug contacting the gate electrode.

Another embodiment is a method including patterning a resist, the resist overlying a dielectric layer. The method also includes etching the dielectric layer based on a pattern of the resist to form an opening in the dielectric layer, the etching stopping on an etch stop layer underlying the dielectric layer. The method also includes while the resist is over the dielectric layer, extending the opening through the etch stop layer. The method also includes forming a conductive element in the opening in the dielectric layer, the conductive element electrically coupled to a first metal feature underlying the etch stop layer.

Another embodiment is a method including forming a first contact plug extending through a second interlayer dielectric (ILD), an etch stop, and a gate mask dielectric, the first contact plug contacting a source/drain contact, where the first contact plug is free from etch damage at an upper surface of the first contact plug. The method also includes forming a second contact plug extending through the second ILD, the etch stop, and the gate mask dielectric, the second contact plug contacting a gate electrode of a gate structure, the gate structure disposed over a semiconductor fin that extends from a substrate, the gate structure including: a gate dielectric on the semiconductor fin, the gate electrode on the gate dielectric, and a gate mask over the gate electrode, where a first ILD material laterally surrounds the gate structure, the gate mask dielectric extending continuously over an upper surface of the first ILD material, where the an etch stop is disposed over the gate mask dielectric.

Another embodiment is a method including forming a mask over a first dielectric layer. The method also includes forming a first opening in the mask, the first opening exposing a portion of the first dielectric layer. The method also includes etching the first dielectric layer while using the mask as an etch mask to form a second opening in the first dielectric layer, the second opening exposing an etch stop layer. The method also includes etching the etch stop layer while using the mask as an etch mask to form a third opening in the etch stop layer. The method also includes forming a first metal feature in the third opening, the first metal feature electrically coupled to a conductive element under the etch stop layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
patterning a resist, the resist overlying a first dielectric layer;
etching the first dielectric layer based on a pattern of the resist to form an opening in the first dielectric layer, the etching stopping on an etch stop layer underlying the first dielectric layer;
while the resist is over the first dielectric layer, extending the opening through the etch stop layer;
after extending the opening through the etch stop layer, etching a second dielectric layer to expose a first metal feature underlying the second dielectric layer, the etched second dielectric layer serving as a mask layer; and
forming a conductive element in the opening in the first dielectric layer, the conductive element electrically coupled to the first metal feature underlying the mask layer.

2. The method of claim 1, further comprising:
forming the resist over the first dielectric layer, wherein prior to forming the resist, the first dielectric layer includes a second metal feature, an upper surface of the first dielectric layer aligned with an upper surface of the second metal feature.

3. The method of claim 2, wherein extending the opening through the etch stop layer uses a wet etch process, and wherein the resist protects the upper surface of the second metal feature from wet etchant while using the wet etch process.

4. The method of claim 1, wherein the etch stop layer comprises a metal oxide.

5. The method of claim 4, wherein the metal oxide is aluminum oxide.

6. The method of claim 1, wherein:
extending the opening through the etch stop layer uses a wet etch process.

7. The method of claim 6, wherein etching the first dielectric layer uses a dry etch process.

8. The method of claim 1, wherein the first metal feature corresponds to a gate electrode of a transistor.

9. The method of claim 1, wherein the second dielectric layer corresponds to a gate mask.

10. A method comprising:
forming a first contact plug extending through a second interlayer dielectric (ILD), an etch stop, and a gate mask dielectric, the first contact plug contacting a source/drain contact, wherein the first contact plug is free from etch damage at an upper surface of the first contact plug; and
forming a second contact plug extending through the second ILD, the etch stop, and the gate mask dielectric, the second contact plug contacting a gate electrode of a gate structure, the gate structure disposed over a semiconductor fin that extends from a substrate, the gate structure comprising: a gate dielectric on the semiconductor fin, the gate electrode on the gate dielectric, and a gate mask over the gate electrode, wherein a first ILD material laterally surrounds the gate structure, the gate mask dielectric extending continuously over an upper surface of the first ILD material, wherein the etch stop is disposed over the gate mask dielectric.

11. The method of claim 10, wherein the first contact plug and the second contact plug are formed in different processes.

12. The method of claim 10, further comprising:
after forming the first contact plug, depositing a photomask over the second ILD;
patterning the photomask to form an opening therein;
etching the second ILD through the opening; and
etching the etch stop through the opening.

13. The method of claim 12, wherein etching the etch stop uses a wet etch technique.

14. The method of claim 13, wherein etching the second ILD uses a dry etch technique.

15. The method of claim 12, further comprising:
removing the photomask after etching the etch stop; and
etching the gate mask dielectric through the etched second ILD to expose the gate electrode.

16. The method of claim 10, wherein the etch stop comprises aluminum oxide, wherein the second ILD comprises a material with a different etch selectivity than the etch stop.

17. A method comprising:
forming a mask over a first dielectric layer;
forming a first opening in the mask, the first opening exposing a portion of the first dielectric layer;
etching the first dielectric layer while using the mask as an etch mask to form a second opening in the first dielectric layer, the second opening exposing an etch stop layer;
etching the etch stop layer while using the mask as an etch mask to form a third opening in the etch stop layer; and
forming a first metal feature in the third opening, the first metal feature electrically coupled to a conductive element under the etch stop layer.

18. The method of claim 17, further comprising:

after etching the etch stop layer, the third opening exposes a second dielectric layer underlying the etch stop layer; and etching the second dielectric layer while using the mask as an etch mask to form a fourth opening in the second dielectric layer, the first metal feature extending through the fourth opening to contact the conductive element.

19. The method of claim 17, wherein etching the first dielectric layer comprises a dry etch, wherein etching the etch stop layer comprises a wet etch.

20. The method of claim 17, the method of claim 9, wherein prior to forming the first opening, the first dielectric layer includes a second metal feature extending through the first dielectric layer.

* * * * *